United States Patent [19]
Blaum et al.

[11] Patent Number: 5,510,912
[45] Date of Patent: Apr. 23, 1996

[54] METHOD AND APPARATUS FOR MODULATION OF MULTI-DIMENSIONAL DATA IN HOLOGRAPHIC STORAGE

[75] Inventors: Miguel M. Blaum; Paul H. Siegel; Glenn T. Sincerbox; Alexander Vardy, all of San Jose, Calif.

[73] Assignee: International Business Machines Corporation, Armonk, N.Y.

[21] Appl. No.: 104,267

[22] Filed: Aug. 9, 1993

[51] Int. Cl.$^6$ ............................................ G02B 5/32
[52] U.S. Cl. ............................ 359/21; 359/29; 359/107; 365/125; 365/216
[58] Field of Search ................ 359/21, 107, 11, 359/29; 365/125, 216; 395/135; 369/103

[56] References Cited

U.S. PATENT DOCUMENTS

| | | | |
|---|---|---|---|
| 3,871,740 | 3/1975 | Matsubara et al. | 359/21 |
| 3,884,546 | 5/1975 | Chu | 359/29 |
| 4,143,937 | 3/1979 | Yonezawa et al. | 359/29 |
| 4,163,290 | 7/1979 | Sutherlin et al. | 365/125 |
| 4,309,694 | 1/1982 | Henry | 340/347 |
| 4,318,581 | 3/1982 | Guest et al. | 359/21 |
| 4,655,542 | 4/1987 | Dube | 359/107 |
| 5,007,690 | 4/1991 | Chern et al. | 350/3.68 |
| 5,067,792 | 11/1991 | Lloyd | 359/32 |
| 5,131,055 | 7/1992 | Chao | 359/107 |
| 5,412,592 | 5/1995 | Krishnamoorthy et al. | 369/103 |
| 5,450,218 | 9/1995 | Heanue et al. | 359/21 |

FOREIGN PATENT DOCUMENTS

| | | | |
|---|---|---|---|
| 2355129 | 9/1976 | Germany | 365/125 |
| 54-40651 | 3/1979 | Japan | 365/216 |

OTHER PUBLICATIONS

S. A. Lis and P. D. Henshaw, Final Report, Ultra–Dense Optical Mass Storage, Prepared for U.S. Air Force Office of Scientific Research, pp. 12–17, Feb. 11, 1991.

D. Psaltis, M. A. Neifeld, A. Yamamura, and S. Kobayashi, "Optical Memory Disks in Optical Information Processing", Applied Optics, vol. 29, No. 14, pp. 2038–2057, May 10, 1990.

Y. Shiloach, "A Fast Equivalence–checking Algorithm for Circular Lists", Information Processing Letters, vol. 8, No. 5, pp. 236–238, Jun. 11, 1979.

S. Hunter, F. Kiamilev, S. Esener, D. A. Parthenopoulos, and P. M. Rentzepis "Potentials of Two–photon Based 3–D Optical memories for High Performance Computing", Applied Optics, vol. 29, No. 14, pp. 2058–2066, May 10, 1990.

(List continued on next page.)

*Primary Examiner*—Paul M. Dzierzynski
*Assistant Examiner*—John Juba, Jr.
*Attorney, Agent, or Firm*—James C. Pintner; Philip E. Blair

[57] ABSTRACT

A modulator apparatus for modulating arrays of input data $V_{in}$ to be stored in a holographic recording medium is disclosed wherein the final output data array $V_{out}$ has frequent transitions from light to dark and from dark to light in either dimension across the data page and has the total amount of illuminated regions throughout the entire data page held constant. These two constraints are achieved by a first set of control arrays obtained from two fixed sets of m×n binary arrays $\{A_0, A_1, \ldots, A_n\}$ and $\{B_0, B_1, \ldots, B_m\}$ which in turn are obtained from fixed sets of binary control vectors $\{\vec{a}_0, \vec{a}_0, \vec{a}_1, \ldots, \vec{a}_n\}, \{\vec{b}_0, \vec{b}_1, \ldots, \vec{b}_m\}$, respectively. The control vectors $\vec{a}_0, \vec{a}_1, \ldots, \vec{a}_n$ any n+1 fixed elements of the inverse mapping, $\phi^{-1}(C_1)$, of the (t-2) error-correcting code $C_1$ of length m. The control vectors $\vec{b}_0, \vec{b}_1, \ldots, \vec{b}_m$ are any m+1 fixed elements of the inverse mapping, $\phi^{-1}(C_2)$, of the (t-s) error-correcting code $C_2$ of length n. The first constraint is achieved by $V'_{in} = V_{in} \oplus (A \oplus B)$. In order to balance the modulated array, a second set of control arrays $\{W_0, W_1, W_2, \ldots, W_1, W_2, \ldots, W_{mn-1}\}$ is obtained from the set of control vectors $\{\vec{W}_0, \vec{W}_1, \vec{W}_2, \ldots, \vec{W}_{mn-1}\}$. The second constraint is achieved by complementing the bits of the input binary array $V'_{in}$ in a horizontal readout order terminating after the first i bits. The final modulated output array $V_{out} = V'_{in} \oplus W$ simultaneously satisfies both constraints.

3 Claims, 9 Drawing Sheets

OTHER PUBLICATIONS

D. Knuth "Efficient Balanced Codes", IEEE Transactions on Information Theory, vol. IT–32, No. 1, pp. 51–53, Jan. 1986.

K. Hacking, I. Childs, "Digital Recording Using Hologram Arrays: Laser–beam Deflection and Modulation", BBC Research Department, Mar. 1979.

K. A. Schouhamer Immink, "Spectral Null Codes" IEEE Transactions on Magnetics, vol. 26, No. 2, pp. 1130–1135, Mar. 1990.

A. X. Widmer and P. A. Franaszek, "A DC–Balanced, Partitioned–Block, 8B/10B Transmission Code", IBM J. Res. Develop., vol. 27, No. 5, Sep. 1983.

$\vec{a}_0 = \vec{b}_0 = 0\ 0\ 0\ 0\ 0\ 0\ 0\ 0\ 0\ 0\ 0\ 0\ 0\ 0\ 0$ $\vec{a}_1 = \vec{b}_1 = 0\ 0\ 0\ 0\ 1\ 1\ 0\ 1\ 0\ 0\ 0\ 0\ 0\ 1\ 1\ 1$ $\vec{a}_2 = \vec{b}_2 = 0\ 1\ 1\ 1\ 1\ 0\ 0\ 1\ 0\ 1\ 1\ 1\ 1\ 0\ 0\ 0$ $\vec{a}_3 = \vec{b}_3 = 0\ 1\ 1\ 1\ 0\ 1\ 0\ 0\ 0\ 1\ 1\ 1\ 1\ 1\ 1\ 1$ $\vec{a}_4 = \vec{b}_4 = 0\ 0\ 1\ 1\ 1\ 1\ 0\ 0\ 1\ 0\ 1\ 1\ 1\ 0\ 0\ 0$ $\vec{a}_5 = \vec{b}_5 = 0\ 0\ 1\ 1\ 0\ 0\ 0\ 1\ 1\ 0\ 1\ 1\ 1\ 1\ 1\ 1$ $\vec{a}_6 = \vec{b}_6 = 0\ 1\ 0\ 0\ 0\ 1\ 0\ 1\ 1\ 1\ 0\ 0\ 0\ 0\ 0\ 0$ $\vec{a}_7 = \vec{b}_7 = 0\ 1\ 0\ 0\ 1\ 0\ 0\ 0\ 1\ 1\ 0\ 0\ 0\ 1\ 1\ 1$ $\vec{a}_8 = \vec{b}_8 = 0\ 0\ 0\ 1\ 1\ 1\ 1\ 0\ 0\ 1\ 0\ 1\ 1\ 0\ 0\ 0$ $\vec{a}_9 = \vec{b}_9 = 0\ 0\ 0\ 1\ 0\ 0\ 1\ 1\ 0\ 1\ 0\ 1\ 1\ 1\ 1\ 1$ $\vec{a}_{10} = \vec{b}_{10} = 0\ 1\ 1\ 0\ 0\ 1\ 1\ 1\ 0\ 0\ 1\ 0\ 0\ 0\ 0\ 0$ $\vec{a}_{11} = \vec{b}_{11} = 0\ 1\ 1\ 0\ 1\ 0\ 1\ 0\ 0\ 0\ 1\ 0\ 0\ 1\ 1\ 1$ $\vec{a}_{12} = \vec{b}_{12} = 0\ 0\ 1\ 0\ 0\ 0\ 1\ 0\ 1\ 1\ 1\ 0\ 0\ 0\ 0\ 0$ $\vec{a}_{13} = \vec{b}_{13} = 0\ 0\ 1\ 0\ 1\ 1\ 1\ 1\ 1\ 1\ 1\ 0\ 0\ 1\ 1\ 1$ $\vec{a}_{14} = \vec{b}_{14} = 0\ 1\ 0\ 1\ 1\ 0\ 1\ 1\ 1\ 0\ 0\ 1\ 1\ 0\ 0\ 0$ $\vec{a}_{15} = \vec{b}_{15} = 0\ 1\ 0\ 1\ 0\ 1\ 1\ 0\ 1\ 0\ 0\ 1\ 1\ 1\ 1\ 1$ $\vec{a}_{16} = \vec{b}_{16} = 0\ 0\ 0\ 0\ 1\ 1\ 1\ 1\ 0\ 0\ 1\ 0\ 1\ 0\ 0\ 0$

METHOD AND APPARATUS FOR MODULATION OF MULTI-DIMENSIONAL DATA IN HOLOGRAPHIC STORAGE

FIELD OF THE INVENTION

Broadly conceived, the present invention relates to storage and retrieval of arrays of data stored in a holographic storage system, and in particular, to modulation/demodulation of such arrays.

BACKGROUND HISTORY

Information storage devices are approaching their physical capacities to store information serially, i.e., as a long continuous stream of 1's and 0's. In order for storage devices to increase the amount of stored information which can be readily accessible, present technologies are beginning to shift away from semiconductor memories, magnetic recording media, and tape storage devices due to inherent limitations such as slow access times and limited capacities and into multi-dimensional storage media which enable very high capacities with fast parallel access.

One such multi-dimensional device is the holographic storage medium wherein entire pages of data are intermingled with each other such that numerous pages of data are recorded in a common volume of the storage media. Such volumetric storage can vastly increase the amounts and kinds of information which can be stored. These systems have the primary advantage of retrieving a page of data in a single read and storing an entire page in a single write operation thus increasing data access speeds.

In holographic storage, in general, two-dimensional data pages are optically recorded via a complex interference process wherein the data pages are initially stored in digital form on a page composer or spatial light modulator. The presence or absence of light at a given bit location represents either a 1 or 0 respectively. The data pages are subsequently retrieved by illumination of the hologram by a matched two-dimensional array of photo-detectors.

More specifically, holography is a form of 3-dimensional recording utilizing coherent light with photo-sensitive media to record and reproduce the amplitude and phase of an optical wavefront. In part, preparation of the hologram involves the channeling of a highly coherent light source, such as a laser, to illuminate both a subject and a photo-sensitive medium wherein an interference pattern is generated between the beams of light scattered from the subject (referred to as the object wavefront) and the light impinging directly on the medium (referred to as the reference wavefront). A lens is interposed between the input data field and the recording medium such that a Fourier transform of the input data is formed on the recording medium. This Fourier transform represents the spatial frequency content of the input data. It is this light distribution that interferes with the reference beam to form the hologram. A recording medium having sufficient resolution and dimension is positioned in the region of overlap to record a sample of the interference pattern. The interference pattern, which occurs in the region of overlap of the two wavefronts, typically consists of a plurality of bright regions wherein the object and reference wavefronts constructively interfere with one another and thus enhance one another, and a plurality of dark regions wherein the wavefronts destructively interfere and thus cancel each other out. In addition to recording the interference between the object and reference wavefronts, the hologram also records the interference between the many wavefronts coming from the object (data patterns) by itself, i.e., each 1 in the data field generates a wavefront that interferes with the wavefronts from the other 1's in addition to interfering with the reference wavefront. The object wavefront can be reconstructed via diffraction from the recording, now a hologram, by illumination with a replica of the original reference wavefront at the same angle of incidence and wavelength as was used during the recording process. The reconstructed object wavefront contains all the amplitude and phase information of the original object wavefront and can be processed as if the original information was still in place.

Because the hologram may have a relatively large thickness of up to several millimeters, each of these individual wavefronts interact with the many secondary holograms to also diffract light into the image. Although the diffraction process from secondary holograms is much weaker than diffraction from the primary reference-beam/object-beam hologram, (because the beam intensities forming the secondary holograms are much weaker and the beams illuminating these holograms are also weaker), broad areas of 1's in the data field should be avoided because these beams of diffracted light will appear to the sides of the desired beam and may cause light to fall on a dark region ( or 0) thereby changing that data bit. The concentration of light into localized regions would cause a situation similar to overexposure in photography, (i.e., the dynamic range of the recording medium may be exceeded) and the recording and reconstruction would not be a true reproduction of the original data.

An example of such a detrimental code pattern is illustrated in FIG. 1A wherein a large block of light (1's) is recorded adjacent to a similarly large block of dark (0's). Although this pattern consists of 50% 1's and 50% 0's, relatively large regions of 1's may expose adjacent regions of 0's. In order to prevent the concentration of light into localized regions, it is important that the recorded information be spread evenly over the available spatial range.

Even distribution of the bits of 1's and 0's across the data page requires more consideration than merely the avoidance of light regions juxtaposed to dark regions. The property of periodicity affects the Fourier transform of the input data that is formed on the recording medium. This Fourier transform represents the spatial frequency content of the input data and it is this light distribution that interferes with the reference beam to form the hologram. For instance, FIG. 1B represents another detrimental data pattern even though that data page also has 50% 1's and 50% 0's. This highly periodic pattern has distinct peaks of intensity in the Fourier transform plane due to the periodicity of the data patterns. Therefore, in order not to permit variations in the intensity of the reconstructed image and so as not to permit wide variations in the ratio between the signal beam and the reference beam during recording, the 1's and 0's in any region of the data page should be balanced and evenly distributed at the same time.

SUMMARY AND OBJECTS OF THE INVENTION

The present invention relates to modulation of arrays of data stored in a holographic recording medium.

It is a primary object of the present invention to provide a modulator for modulating data pages stored in a holographic recording medium which eliminates long periodic stretches of contiguous light or dark regions in any of the dimensions of the holographic medium such that interference between adjacent images recorded in the same volume is efficiently minimized.

It is another primary object of the present invention to provide a modulator for modulating data pages stored in a holographic recording medium which divides the light and dark regions stored in the holographic medium into the same number of 1's and 0's independent of data content so as to increase the reliability characteristics of the data by reducing the noise encountered while differentiating between the light and dark states.

It is yet another object of the present invention to simultaneously achieve the modulation constraints which follow from the above primary objectives with minimum overhead.

Briefly and to achieve the objects of the present invention, a modulator for modulating arrays of data stored in a holographic recording medium is disclosed. Two constraints are imposed on the data modulated by the modulator of the present invention. First, in order to avoid long periodic stretches of contiguous light or dark regions within the stored data page, it is preferable to have frequent transitions from light to dark and from dark to light in either dimension across the data page. Second, it is preferable to have the total amount of illuminated regions throughout the entire data page held constant within any sufficiently large rectangular area of that page. The modulator of the present invention achieves the satisfaction of these two constraints by the application of a first set of control arrays $\square_1$ to achieve the first constraint and a second set of control arrays $\square_2$ to achieve the second constraint.

The first set of control arrays $\square_1$ is obtained from two fixed sets of m×n binary arrays $\square_A = \{A_0, A_1, \ldots, A_n\}$ and $\square_B = \{B_0, B_1, \ldots, B_m\}$. The fixed sets of binary arrays $\square_A$ and $\square_B$ are obtained from the fixed sets of binary control vectors $\{\vec{a}_0, \vec{a}_1, \ldots, \vec{a}_n\}$, $\{\vec{b}_0, \vec{b}_1, \ldots, \vec{b}_m\}$, respectively, wherein the sets of control vectors are defined as:

$$\{\vec{a}_0, \vec{a}_1, \ldots, \vec{a}_n\} \subset \phi^{-1}(C_1) = \{\phi^{-1}(\vec{c}), c \in C_1, |\vec{c}| \equiv 0 \bmod 2\}$$

$$\{\vec{b}_0, \vec{b}_1, \ldots, \vec{b}_m\} \subset \phi^{-1}(C_2) = \{\phi^{-1}(\vec{c}), c \in C_2, |\vec{c}| \equiv 0 \bmod 2\}$$

The individual control vectors $\vec{a}_0, \vec{a}_1, \ldots, \vec{a}_n$ are any n+1 fixed elements of the inverse mapping, $\phi^{-1}(C_1)$, of the (t−2) error-correcting code $C_1$ of length m. The control vectors $\vec{b}_0, \vec{b}_1, \ldots, \vec{b}_m$ are any m+1 fixed elements of the inverse mapping, $\phi^{-1}(C_2)$, of the (t−2) error-correcting code $C_2$ of length n. In other words, the control vectors $\vec{a}_i$ and $\vec{b}_i$ must be found such that adding vector $\vec{a}_i$ to all the columns of the array $V_{in}$ produces at least t transitions in each column and adding $\vec{b}_j$ to all the rows of $V_{in}$ produces at least t transitions in each row. If $\{\vec{v}_1, \vec{v}_2, \ldots, \vec{v}_{hd\,n}\}$ is the set of columns of the array $V_{in}$ then the control vector $\vec{a}_i$ is determined by checking for each $i=0, 1, 2, \ldots$, whether all the vectors in the set $\vec{a}_i + \vec{v}_1, \vec{a}_i + \vec{v}_2, \ldots, \vec{a}_i + \vec{v}_n$ have at least t transitions and terminating at the first index i for which the above condition holds. The control vector $\vec{b}_j$ is determined in a similar manner by operating on the rows of the input array $V_{in}$ rather than on its columns. Further, a mapping $\phi: F_n \to E_n$ exists such that the set of all binary n-tuples $F_n$ is mapped onto the set of all n-tuples of even weight $E_n$ and is defined as: $\phi(\vec{x}) = \vec{x} \oplus \sigma(\vec{x})$, where $\sigma$ is either $\sigma_L$ or $\sigma_R$. The inversely mapped vector $\phi^{-1}(\vec{y})$ is equal to $\vec{x}$ if and only if the mapped vector $\phi(\vec{x})$ is equal to $\vec{y}$ and $x_1=0$. In such a manner, $\square_1 = \{A \oplus B: A \in \square_A, B \in \square_B\}$.

In order to balance the modulated array, a second set of control arrays $\square_2 = \{W_0, W_1, W_2, \ldots W_{mn-1}\}$ is obtained from the set of control vectors $\{\vec{w}_0, \vec{w}_1, \vec{w}_2, \ldots, \vec{w}_{mn-1}\}$. The second constraint is achieved by complementing the bits of the input binary array in a horizontal readout order terminating after the first i bits. As such, the final modulated output array, given by $V_{out}=(V_{in}\oplus U)\oplus W$, wherein the selected control array $U \in \square_1$ and wherein the selected control array $W \in \square_2$, simultaneously satisfies both constraints.

It is an advantage of the present invention to have a modulator which minimizes errors and increases the accuracy of the data pages read by the array of photo-detecting elements thereby reducing re-read operations and increasing data access speeds.

It is another advantage of the present invention to have a modulator which eases the design parameters required to ensure the accuracy of the data stored/retrieved from the holographic medium.

Additional objects and advantages of the present invention will be set forth in the description which follows, and in part will be obvious from the description or may be learned by the practice of this invention. The objects and advantages of this invention as described herein may be realized and obtained by means particularly pointed out and distinctly claimed in the appended claims taken in conjunction with the drawings and detailed specification.

BRIEF DESCRIPTION OF THE DRAWINGS

In order to elucidate the manner in which the above-recited and other advantages and objects of the present invention are obtained, a more particular description of this invention, briefly described above, will be rendered by reference to a specific embodiment thereof which is illustrated in the appended drawings. Understanding that these drawings depict only a typical embodiment of the present invention and are not therefore to be considered in any way limiting of its scope, this invention will be described and explained with additional specificity and detail through the use of the accompanying drawings, in which:

FIG. 1A and 1B are illustrations of undesirable patterns of 1's and 0's in the prior art which make reconstruction of the stored data image less reliable:

FIG. 7 is a set of 17 control vectors obtained by applying the inverse mapping $\phi^{-1}$ to some of the 32 even-weight codewords of, for example, the first-order Reed-Muller code of length 16:

FIG. 8 illustrates an input 16×16 binary array $V_{in}$ to be modulated by the modulator of the present invention:

FIG. 9 illustrates array $V'_{in}$ at the output of the first modulator;

FIG. 10 illustrates array W which balances the array $V'_{in}$;

FIG. 11 illustrates the result of the addition of array W to array $V'_{in}$;

FIG. 12 illustrates the final modulated array; and

DETAILED DESCRIPTION OF THE PREFERRED EMBODIMENT

The present invention is directed to modulators which modulate data pages in a multi-dimensional context to ensure optimum operation of a holographic data storage and retrieval system.

A HOLOGRAPHIC STORAGE SYSTEM (FIG. 2)

Figure 2:
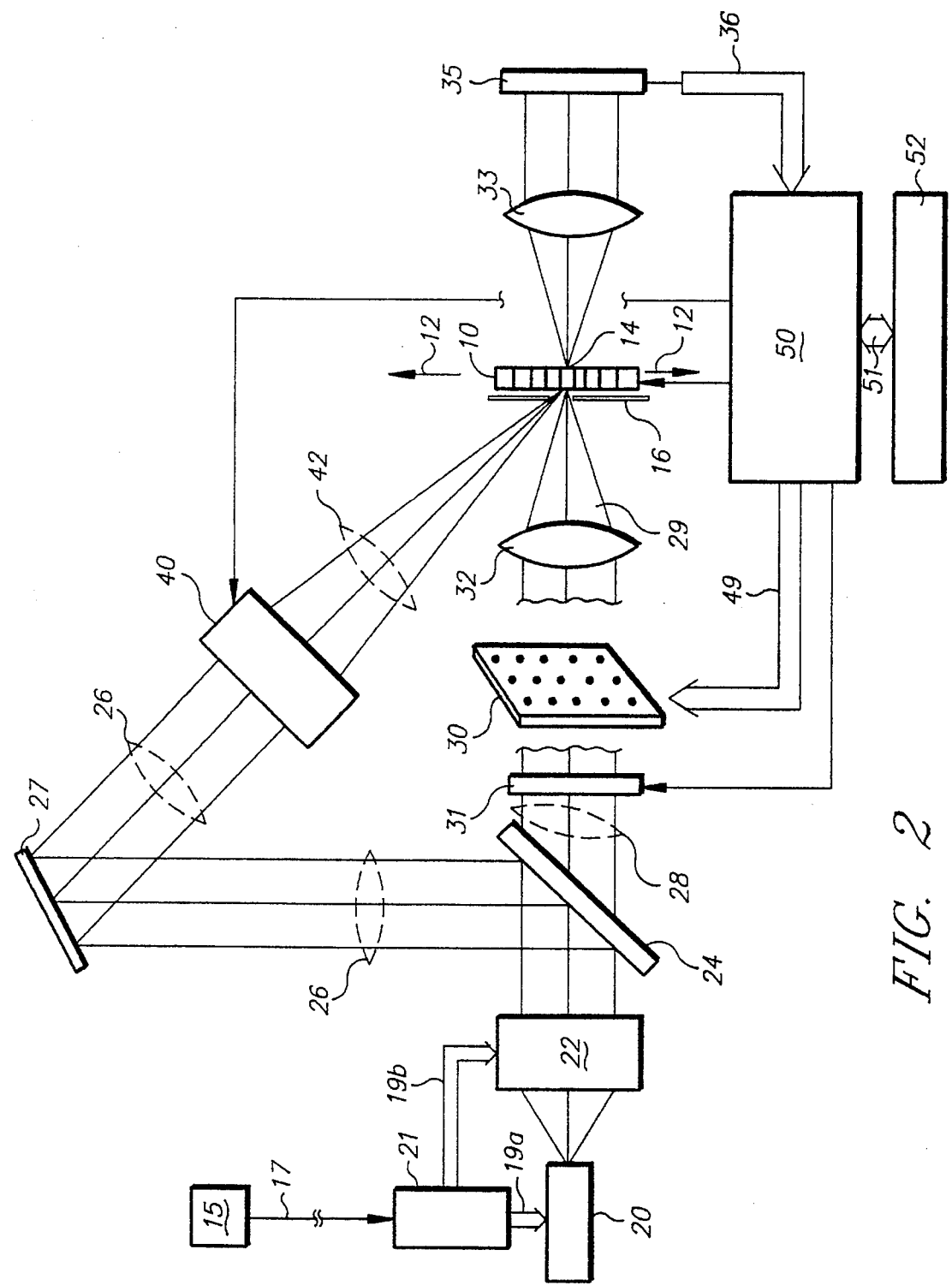
FIG. 2 is a schematic block diagram illustrating the major components of a volume holographic storage system.

Prior to the discussion of the modulation method and apparatus of the present invention an overview of a hologram storage system wherein the present invention finds its uses should initially be introduced. A general schematic of a volume hologram system is illustrated in FIG. 2 which is a diagram of a holograph storage system having a multiplexer 40. The holographic recording medium 10 is a thick film recording material which is movable along an axis in the directions shown by the arrows 12 so that individual discrete sections of the medium 10, such as section 14, may be located in front of a fixed mask 16 through which the light may enter. The data to be stored enters the modulation unit 21 of the present invention from a data source 15 over line 17. The data source being any data generation or transmission device the data from which is to be stored on the holographic medium 10. The modulation unit 21 modulates the data in accordance with the techniques of the present invention and transmits the modulated data arrays over bus 19a to affect the light source 20 and over bus 19b to affect the beam-forming optics 22. It should be understood that a specific implementation may vary wherein the modulator of the present invention is connected/interfaced with a holographic system in other manners so long as the data to be stored on the holographic medium is modulated by the techniques disclosed herein.

A light source 20 generates a single monochromatic, coherent light beam that is directed through a set of beam-forming optics 22 which expand and collimate the output from the light source. The single-beam output from the beam-forming optics is then split by a conventional beam splitter 24 into a reference beam 26 and an object or signal beam 28.

A page composer or spatial light modulator 30 and a Fourier transform lens 32 are located in the signal beam between the light source and the medium. The spatial light modulator 30 a two-dimensional array of shutters which either permit or block part of the signal beam. The lens 32 is located a focal distance from both the spatial light modulator 30 and the holographic medium 10 to form the Fourier transform of the light distribution impressed by spatial light modulator 30 in the signal beam onto designated recording section 14 of the recording medium 10. The lens 32 thus takes the point sources of light which come from spatial light modulator 30 diverging beams of light and directs them to the medium 10 as parallel beams. Each parallel beam corresponds to light transmitted through one of the cells of the two-dimensional array of the spatial light modulator 30. These individual beams become signal beam 29 and arrive at different angles at the medium 10 from lens 32 to overlap at the recording section 14 the medium 10.

The reference beam 26, which is split by the beam splitter 24, is directed by a mirror 27 through the multiplexer 40 and onto the recording section 14 of the medium 10. Both the output reference beam 42 from the multiplexer 40 and the individual beams 29 from the Fourier lens arrive simultaneously and interfere with one another in the medium. A shutter 31 is located in the path of the signal beam 28 between the beam splitter 24 and the spatial light modulator 30 for the blocking of the signal beam 28 during reconstruction of the recorded hologram. An inverse Fourier transform lens 33 is located on the side opposite the recording medium from the lens and is spaced a focal distance from the medium 10 and from a data detector array 35. The data retrieved from the medium 10 is reconstructed by the movement of the shutter 31 into the signal beam 28 so that only the reference beam is directed to the recording section 14 the medium 10 as to generate the transform image of the recorded hologram that is directed to the detector array 35. The detector array 35 has the same two-dimensional array pattern as the spatial light modulator 30 so that its output corresponds to the data output of the spatial light modulator 30.

A controller 50 receives data from a data bus 51 connected to the host central processing unit 52 (CPU) and transmits that data as a page of digital data to the spatial light modulator 30 via bus 49. The controller 50 also receives data output from the data detector array 35 via data bus 36 and directs it back to the CPU via a bus 51. The data controller 50 is also electrically connected to the shutter 31, multiplexer 40 and the movable recording medium 10.

To record a first page of data into the recording section 14, of the medium 10, the data controller 50 moves the shutter 31 out of the path of the signal beam 28, translates the storage medium 10 so that the designated recording section 10 is in alignment with the opening mask 16, and signals the multiplexer. If the multiplexer 40 is an angular multiplexing device, it is moved to its first angular position. The data making up the first page is then recorded in the recording section 14 of the medium 10 by the interference of the reference beam with the signal beam that has passed through the spatial light modulator 30 whose array has received the page of data from the controller 50. To record the next page in the same section 14 of the recording medium 10, the controller 50 signals the multiplexer to move its next angular position and the second page is recorded in the same fashion. Depending upon the number of angular positions obtainable by the multiplexer, a plurality of pages are thus recorded in the medium 10. When the maximum number of pages is recorded, the controller 50 then moves the medium 10 until the next adjacent section, or any next section of the medium 10 is aligned with the opening in mask 16. In this manner, multiple pages can be multiplexed onto individual sections of the medium 10 and multiple sections can be addressed by the controller 50.

When it is desired to read out data recorded in the medium 10, the controller 50 moves the shutter 31 into the signal beam 28 to block the signal beam 28 so that only the reference beam is on, and it signals the multiplexer 40 to the correct angular position. This reference beam then becomes a reconstructing beam with the same wavelength and angle as the reference beam which is directed to the appropriate section of the recording medium and reconstructs the recorded image through inverse transform lens 33 onto the detector array 35.

It should be understood that the holographic storage system of FIG. 2 is typical of one such holographic system wherein the present invention finds its intended uses. Therefore, the present invention is not to be considered as being applicable or limited only to the holographic storage system described above but to any holographic system wherein the previously discussed problems to which the present invention is directed are inherent therein.

DESIRABLE MODULATION CONSTRAINTS

Figures 1A, 1B:
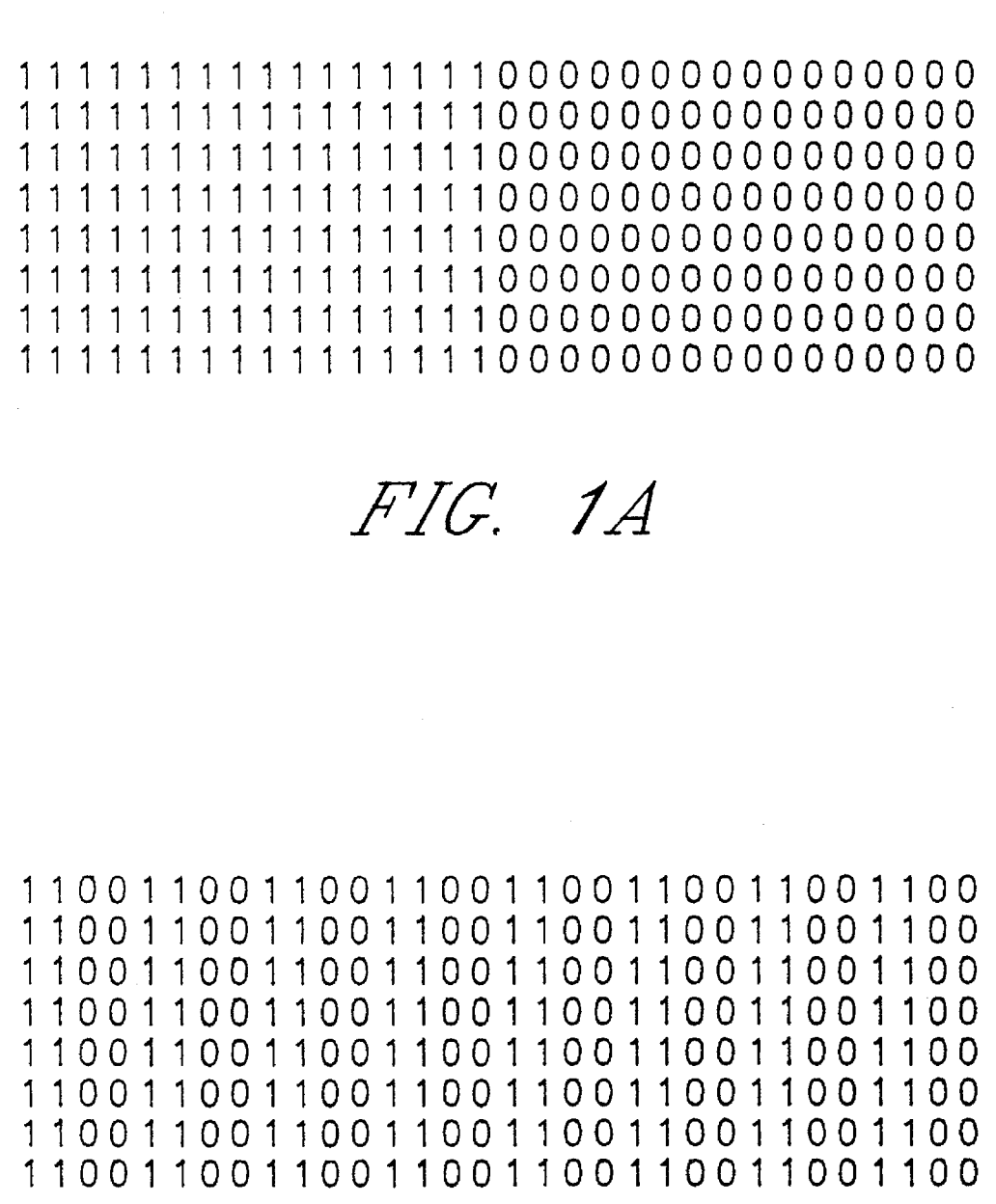
Figure 3:
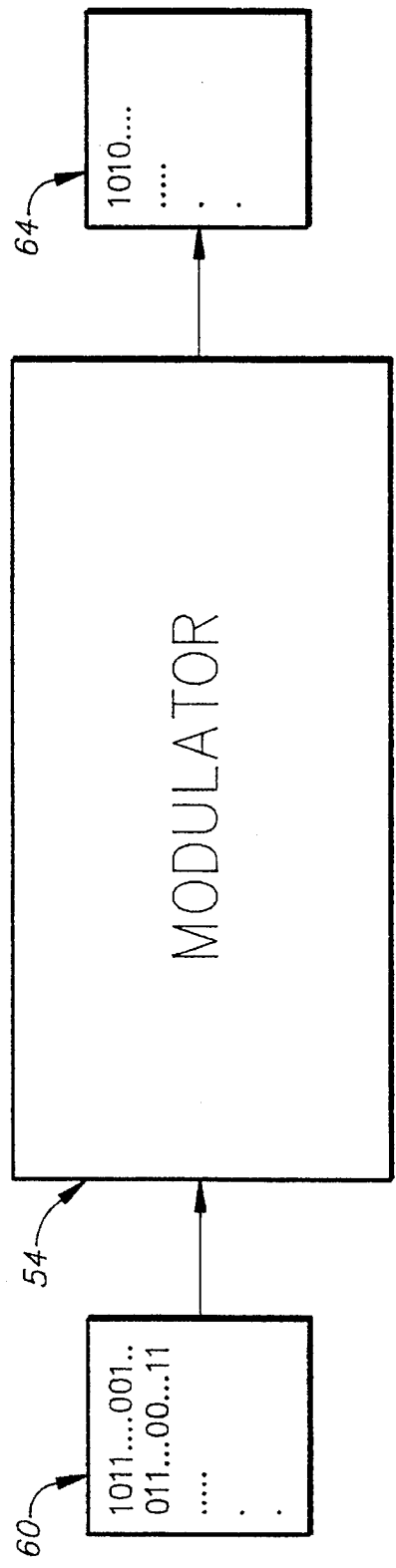
FIG. 3 is a diagram illustrating the modulation of an input data page to produce an output data page.

In order to discuss the particulars of the data modulator of the present invention for use in a holographic storage system as described and to overcome the problems in the prior art which are illustrated by FIGS. 1A and 1B, the basic concept of data modulation should be initially discussed. Reference is now being made to FIG. 3 which is an illustration of a modulator. The data modulator 54 is either a hardware or software construct into which an input data page 60 consisting of one or more arrays of data is directed wherein the data bits on the input data page are manipulated (modulated) to produce the output data page 64. The bits of the output data page are arranged so as to meet the specific modulation constraints to be achieved by the modulator.

A data page to be stored in the holographic medium is considered for the discussion herein to be composed of one or more two-dimensional arrays of binary coded data (bits of 1's and 0's) which represent the illuminated and dark regions respectively of the data page. These binary arrays are of size m×n. where m and n are integers. For the present invention and to solve the above-recited heretofore unsolved problems in this art, the patterns of illuminated regions (1's) and the dark regions (0's) of the data page to be stored on the holographic medium have to satisfy certain predefined constraints. These modulation constraints are stated herein in terms of the properties that each of the binary output arrays eventually satisfies upon completion of the modulation thereof.

First, in order to avoid long periodic stretches of contiguous light or dark regions within the stored data page, it is preferable to have frequent transitions from light to dark, herein denoted as $(1 \searrow 0)$, and from dark to light, denoted $(0 \nearrow 1)$, in either dimension across the data page. Thus, the first constraint is with the number of transitions thereby identifying property $P_1(t)$ that the first modulator of FIG. 4 must achieve. Specifically, that modulator must achieve the constraint that in each row and column of the modulated data array there are at least t transitions of the type $(1 \searrow 0)$ or $(0 \nearrow 1)$, where t is a predetermined integer greater than 2. Second, it is also preferable to have the total amount of illuminated bits throughout the entire data page held constant within any sufficiently large rectangular area of that page. Thus, a second constraint is achieved by the second modulator of FIG. 5 to ensure distributed constant illumination. Specifically, that modulator must achieve the property $P_2$ which is the constraint that the number of 1's in each modulated data array is equal to the number of 0's in that array.

Figure 4:
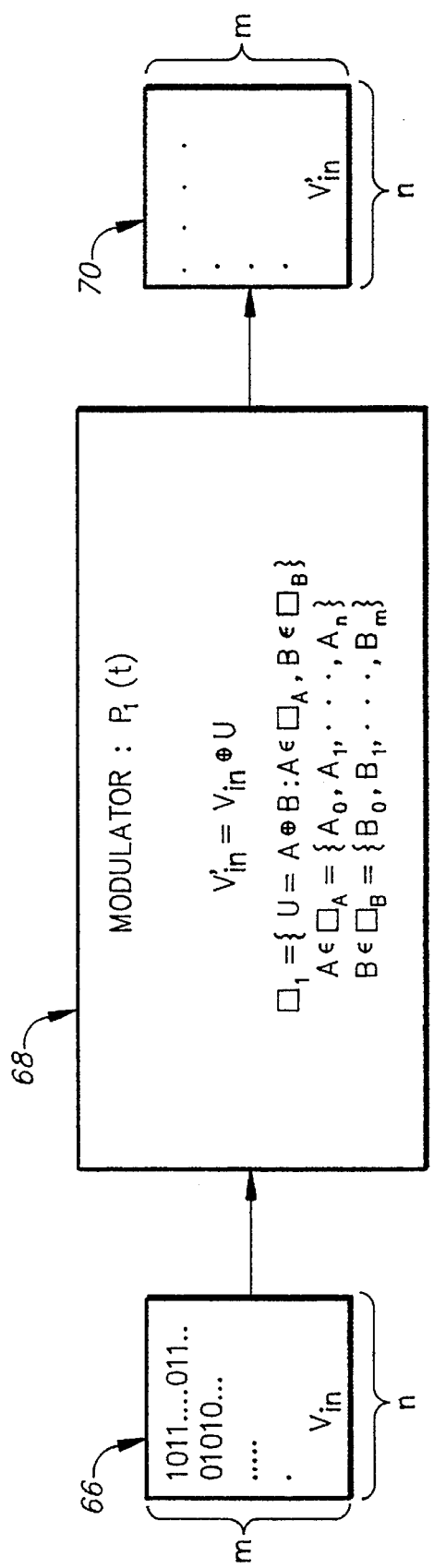
FIG. 4 is a diagram of a first modulator wherein an input array in modulated with a single array taken from a set of control arrays $\square_1$ such that in each row and column of the output array there are at least t transitions.
Figure 5:
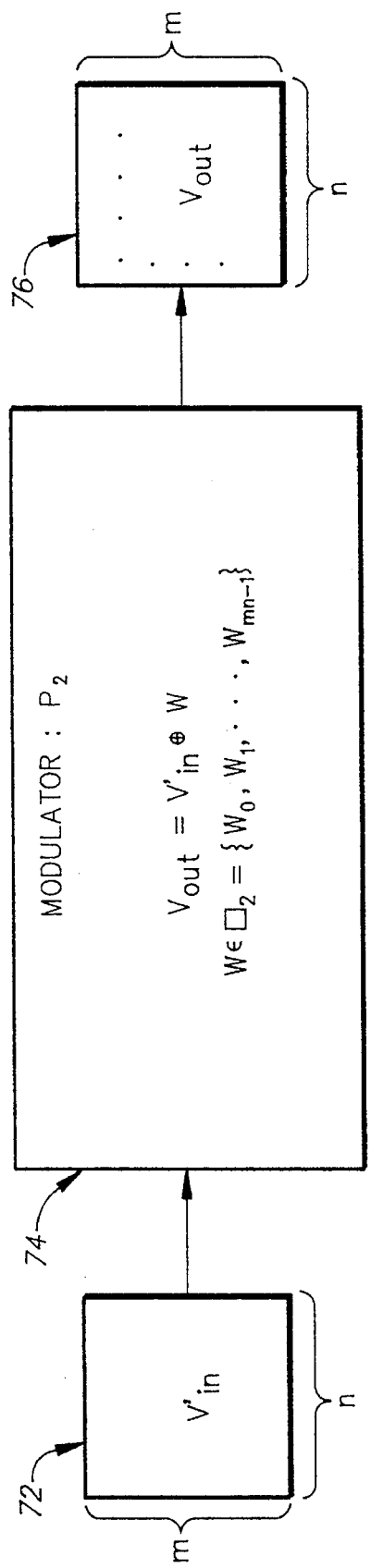
FIG. 5 is a diagram of a second modulator wherein an input array is modulated with a single array taken from a set of control arrays $\square_2$ such that the number of 1's in the output array is equal to the number of 0's in the array.

Reference is now made to FIGS. 4 and 5. Each modulator has an m×n binary array as input. The input array 66 is modulated by the first modulator 68 to produce output array 70 such that property $P_1(t)$ (i.e., in each row and column of the array there are at least t transitions) is satisfied. The second modulator 74 of FIG. 5 receives the output array 70 of the first modulator 68 of FIG. 4 as its m×n input data array 72. The second modulator further constrains its input array 72 to produce output array 76 such that property $P_2$ (i.e., the number of 1's in the array is equal to the number of 0's in the array) is satisfied.

Figure 6:
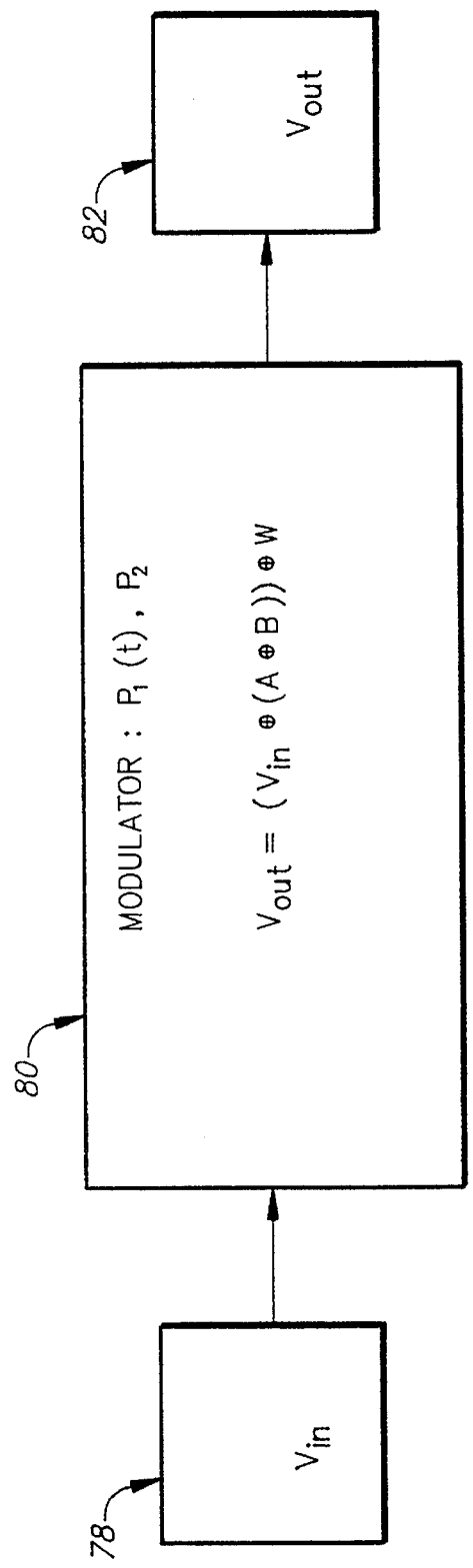
FIG. 6 is a diagram of a modulator encompassing both the first and second modulators of FIGS. 3 and 4, such that the combination of first and second constraints is satisfied.

The modulator envisioned herein to achieve the two constraints imposed to overcome the problem in the art is shown in FIG. 6 which is an illustration of a modulator encompassing both the first and second modulators of FIGS. 4 and 5. The combined modulator 80 modulates input data array 78 to produce output data array 82.

The combined modulator of the present invention achieves the satisfaction of the two properties previously discussed by the application of a first set of control arrays, denoted $\Box_1$, to achieve $P_1(t)$ and $\Box_2$ for the second set of control arrays to achieve $P_2$. In other words, the sets of control arrays for both the first and second modulators are specifically constructed such that for any m×n input data array $V_{in}$, wherein the selected control array $U \in \Box_1$ and the selected control array $W \in \Box_2$, the output data array $V_{out} = (V_{in} \oplus U) \oplus W$ simultaneously satisfies $P_1(t)$ and $P_2$.

NOTATION, UNDERLYING PRINCIPLES

However, prior to constructing the sets of control arrays to achieve the objectives of the present invention, some notation must be introduced and understood. It is important because the underlying principles are important to an understanding as to why the modulation properties put forth above are achieved.

Let $F_n$ denote the set of all binary n-tuples. For two vectors $\vec{x}, \vec{y} \in F_n$, the Hamming distance between $\vec{x}$ and $\vec{y}$, denoted $d(\vec{x}, \vec{y})$, is the number of positions in which vectors $\vec{x}$ and $\vec{y}$ differ. The Hamming weight of $\vec{x} \in F_n$ is given by $|\vec{x}| = d(\vec{x}, \vec{0})$, where $\vec{0}$ denotes the all-zero n-tuple (00 ... 0). The set of all the n-tuples of even weight is denoted $E_n$. For any vector $\vec{x} = (x_1, x_2, \ldots, x_n) \in F_n$, $\sigma_R(\vec{x}) = (x_n, x_1, \ldots, x_{n-1})$ is the right cyclic shift of vector $\vec{x}$. The left cyclic shift of vector $\vec{x}$ is $\sigma_L(\vec{x}) = (x_2, x_3, \ldots, x_m, x_1)$. A mapping $\phi: F_n \rightarrow E_n$ exists such that the set of all binary n-tuples $F_n$ is mapped onto the set of all n-tuples of even weight $E_n$ and is defined as: $\phi(\vec{x}) = \vec{x} \oplus \sigma(\vec{x})$, where $\sigma$ is either $\sigma_L$ or $\sigma_R$. At this point, one skilled in the art should understand that the mapping $\phi$ is linear and that the number of transitions in the vector $\vec{x}$ is equal to the Hamming weight of the mapped vector $\phi(\vec{x})$. The inverse mapping can be formally defined. Assume that vector $\vec{y} = (y_1, y_2, \ldots, y_n)$ is in $E_n$ and vector $\vec{x} = (x_1, x_2, \ldots, x_n)$ is in $F_n$. Then, the inversely mapped vector $\phi^{-1}(\vec{y})$ is equal to $\vec{x}$ if and only if the mapped vector $\phi(\vec{x})$ is equal to $\vec{y}$ and $x_1 = 0$. Since for two distinct binary vectors $\vec{x}$ and $\vec{x}$, $\phi(\vec{x}) = \phi(\vec{x})$ implies that $\vec{x}$ and $\vec{x}$ are binary complements of each other, it follows that each element of the set of all n-tuples of even weight $E_n$ will have exactly one inverse.

FUNDAMENTALS OF ERROR-CORRECTING CODES

Once the above terminology and mapping is understood, some fundamentals with respect to error-correcting codes must also be introduced and understood.

A t-error-correcting code C of length n is a subset of the set of all binary n-tuples $F_n$ with the property that any two n-tuples $\vec{c}_1, \vec{c}_2 \in C$ differ in at least 2t+1 positions. Let $C_1$ be a (t-2)-error-correcting code of length m and assume that $C_1$ contains at least n+1 codewords of even weight. Similarly, let $C_2$ be a (t-2)-error-correcting code of length n containing at least m+1 codewords of even weight. When n and m are powers of 2, such error-correcting codes exist for all $$t \leq \min\left(\frac{n}{4}, \frac{m}{4}\right),$$

which are the first-order Reed-Muller codes of lengths m and n respectively. Error-correcting codes and the techniques involved in their implementation should be readily understood by one skilled in this art. However, if further study of error-correcting codes and the properties inherent thereto is desired, attention is directed to the text by MacWilliams and Sloane, "The Theory of Error-Correcting Codes", New York: North-Holland, (1977).

Finally, it is important to initially specify how transitions are counted for any given row or column vector. If a light region is immediately followed by a dark region within a single vector of the input data array in any dimension, this would count as a single transition denoted as $(1 \searrow 0)$. Likewise, if a 0 is immediately followed by a 1, this would count as a single $(0 \nearrow 1)$ transition. For the purposes of the present invention there is no distinction between $(1 \searrow 0)$ transitions and $(0 \nearrow 1)$ transitions. Further, the transitions are to be counted in a cyclic manner. In other words, the vectors are to be considered as wrapping around themselves to form a circle. Thus, if a vector begins with a 1 and ends with a 0, or vice versa, there is a cyclic transition that should be counted in addition to the transitions that occur within the vector between those two points. For instance, assume that 111000111 and 111000110 are two row or column vectors in the input data array. Counting the number of transitions in a cyclic manner one should conclude that the first vector contains 2 transitions while the second vector contains 4 transitions.

FIG. 4: MODULATION FOR TRANSITIONS

The first portion of the preferred embodiment to be discussed herein involves the construction of a first set of control arrays.

With reference being made to FIG. 4, the first full set of control arrays $\square_1$ is constructed in order to achieve the property $P_1(t)$ constraining the number of transitions in each row and column. The full set of control arrays $\square_1$ is obtained from two fixed sets of m×n binary arrays $A \in \square_A = \{A_0, A_1, \ldots, A_n\}$ and $B \in \square_B = \{B_0, B_1, \ldots, B_m\}$. Specifically, the full set of control arrays $\square_1$ is obtained by performing the operation $A \oplus B$ for each array element A of $\square_A$ and each array element B of the set $\square_B$, namely $\square_1 = \{A \oplus B : A \in \square_A, B \in \square_B\}$.

In order to obtain the full set of control arrays $\square_1$, the fixed sets of individual binary arrays $\square_A = \{A_0, A_1, \ldots, A_n\}$ and $\square_B = \{B_0, B_1, \ldots, B_m\}$ must be obtained. The elements of the fixed set of binary control arrays $\square_A$ and the fixed set of binary control arrays $\square_B$ are specified in the notation $A_i = [a_{jk}^i]$ and $B_i = [b_{jk}^i]$, as follows:

$a_{jk}^i = 1$ if the j-th coordinate of the vector $\vec{a}_i = 1$, 0 otherwise $b_{jk}^i = 1$ if the k-th coordinate of the vector $\vec{b}_i = 1$, 0 otherwise where $i=0,1,2,\ldots,n$ for the set $\square_A$ and where $i=0,1,2,\ldots,m$ for the set $\square_B$, and where the sets of control vectors $\{\vec{a}_0, \vec{a}_1, \ldots, \vec{a}_n\}$ and $\{\vec{b}_0, \vec{b}_1, \ldots, \vec{b}_m\}$ are specified in the following.

In order to obtain the fixed sets of binary arrays $\square_A$ and $\square_B$, the sets of control vectors $\{\vec{a}_0, \vec{a}_1, \ldots, \vec{a}_n\}$, $\{\vec{b}_0, \vec{b}_1, \ldots, \vec{b}_m\}$ must be obtained. To achieve this, the sets of control vectors $\{\vec{a}_0, \vec{a}_1, \ldots, \vec{a}_n\}$ and $\{\vec{b}_0, \vec{b}_1, \ldots, \vec{b}_m\}$ are defined as follows:

$$\{\vec{a}_0, \vec{a}_1, \ldots, \vec{a}_n\} \subset \phi^{-1}(C_1) = \{\phi^{-1}(\vec{c}), \vec{c} \in C_1, |\vec{c}| \equiv 0 \bmod 2\}$$

$$\{\vec{b}_0, \vec{b}_1, \ldots, \vec{b}_m\} \subset \phi^{-1}(C_2) = \{\phi^{-1}(\vec{c}), \vec{c} \in C_2, |\vec{c}| \equiv 0 \bmod 2\}$$

where the meaning of $\subset$ above is that the individual control vectors of the set $\{\vec{a}_0, \vec{a}_1, \ldots, \vec{a}_n\}$ are any n+1 fixed elements of the inverse mapping $\phi^{-1}(C_1)$ of the (t-2)-error-correcting code $C_1$ of length m, and the control vectors of the set $\{\vec{b}_0, \vec{b}_1, \ldots, \vec{b}_m\}$ are any m+1 fixed elements of the inverse mapping $\phi^{-1}(C_2)$ of the (t-2)-error-correcting code $C_2$ of length n.

In other words, the control vectors $\vec{a}_i$ and $\vec{b}_j$ must be found such that adding vector $\vec{a}_i$ to all the columns of the array $V_{in}$ produces at least t transitions in each column and adding $\vec{b}_j$ to all the rows of $V_{in}$ produces at least t transitions in each row. If $\{\vec{v}_1, \vec{v}_2, \ldots, \vec{v}_n\}$ is the set of columns of the array $V_{in}$ then the control vector $\vec{a}_i$ is determined by checking for each $i=0,1,2,\ldots$, whether all the vectors in the set $\vec{a}_i + \vec{v}_1, \vec{a}_i + \vec{v}_2, \ldots, \vec{a}_i + \vec{v}_n$ have at least t transitions and terminating at the first index i for which the above condition holds. The control vector $\vec{b}_j$ is determined in a similar manner by operating on the rows of the input array $V_{in}$ rather than on its columns. It is noted that the control array set $\square_A$ is constructed such that if the set of vectors $\{\vec{v}_1, \vec{v}_2, \ldots, \vec{v}_n\}$ are the columns of input array $V_{in}$, the corresponding columns of $V_{in} \oplus A_i$ are given by the set $\{\vec{v}_1 + \vec{a}_i, \vec{v}_2 + \vec{a}_i, \ldots, \vec{v}_n + \vec{a}_i\}$, (where + indicates the operation of vector addition) and similarly for the control array set $\square_B$.

At this point, it should be understood that adding any one array A from the control array set $\square_A$ to an arbitrary input array $V_{in}$ is equivalent to complementing some of the rows of the input array $V_{in}$. This does not affect the number of transitions in the rows of array $V_{in}$ since any vector and its complement contain the same number of transitions. Similarly, adding any one array B from the control array set $\square_B$ to the input array $V_{in}$ is equivalent to complementing some of its columns and hence does not affect the number of transitions in the columns of array $V_{in}$.

Notice that the complexity of this procedure for determining the control vectors $\vec{a}_i$ and $\vec{b}_j$, and hence also the selected control array $U \in \square_1 = A \oplus B$ which is eventually applied to the input array $V_{in}$, is at most n+m trial steps. Since such complexity is sub-linear (essentially logarithmic) in comparison with the size of the input array $V_{in}$ which contains m×n information bits, the above procedure is acceptable for most practical values of the parameters m and n and is preferred herein. However, if the parameters n and m are exceptionally large, to the extent of several hundred or more, then a different more efficient procedure for determining the control vectors $\vec{a}_i$ and $\vec{b}_j$ is preferably employed. This procedure involves computing the images of the columns and rows of the input array $V_{in}$ under the mapping $\phi$. For instance, let $\vec{x}_1 = \phi(\vec{v}_1)$, $\vec{x}_2 = \phi(\vec{v}_2)$, ..., $\vec{x}_n = \phi(\vec{v}_n)$ be the images of the columns of the array $V_{in}$. If the underlying error-correcting code $C_1$ is the first-order Reed-Muller code, as is the case in the preferred embodiment, then for each vector $\vec{x}_i$ the codeword $\vec{c}_j \in C_1$, which is the closest to vector $\vec{x}_i$, may be readily found using the techniques described in MacWilliams and Sloane. As such, any control vector from the set $\{\vec{a}_0, \vec{a}_1, \ldots, \vec{a}_n\}$, whose image under the mapping $\phi$ is not equal to one of the codewords of error-correcting code $C_1$ that is the closest to one of the vectors $\vec{x}_1, \vec{x}_2, \ldots, \vec{x}_n$ may be taken as the control vector $\vec{a}_i$. The control vector $\vec{b}_j$ may be obtained in a similar manner.

By way of illustration of the techniques to achieve the first constraint, assume that the input arrays are of size n=m=3 and the required number of transitions is t=2. Since t−2=0, any set of distinct even-weight vectors may be taken as error-correcting codes $C_1$ and $C_2$. It should be noted that if t is even and if the number of transitions is less than t then the number of transitions has to be less than t−2 because t−1 is not allowable since the Hamming weight must be even.

Let $C_1 = C_2 = \{000, 011, 110, 101\}$. In this case: $\phi^{-1}(c_1) = 000$, $\phi^{-1}(c_2) = 001$, $\phi^{-1}(c_3) = 010$, $\phi^{-1}(c_4) = 011$. Thus $\phi^{-1}(C_1) = \phi^{-1}(C_2) = \{000, 001, 010, 011\}$. The mapping of $\phi$ here is based upon a left cyclic shift. Since n+1=m+1=4 and the inversely mapped (t−2)-error-correcting codes $\phi^{-1}(C_1)$ and $\phi^{-1}(C_2)$ both contain 4 vectors, the sets of control vectors $\{\vec{a}_0, \vec{a}_1, \vec{a}_2, \vec{a}_3\}$ and $\{\vec{b}_0, \vec{b}_1, \vec{b}_2, \vec{b}_3\}$ are, in this case, equal to $\phi^{-1}(C_1)$ and $\phi^{-1}(C_2)$. Thus: $\{\vec{a}_0, \vec{a}_1, \vec{a}_2, \vec{a}_3\} = \{\vec{b}_0, \vec{b}_1, \vec{b}_2, \vec{b}_3\} = \{000, 001, 010, 011\}$.

Hence, the control arrays $\Box_A = \{A_0, A_1, A_2, A_3\}$, and $\Box_B = \{B_0, B_1, B_2, B_3\}$ are constructed as follows:

```
A0 =  000   A1 = 000   A2 = 000   A3 = 000
      000        000        111        111
      000        111        000        111
B0 =  000   B1 = 001   B2 = 010   B3 = 011
      000        001        010        011
      000        001        010        011
```

The full set of control arrays $\Box_1$ is obtained by the modulo 2 addition of each array of $\Box_A$ to each array of $\Box_B$ in a bit by bit fashion so that $\Box_1 = \{A \oplus B: \in \Box_A B \in \Box_B\}$. Thus, after performing this operation, the final set of control arrays $\Box_1$ consists of the following fixed set of 16 binary arrays:

```
000  000  000  000  001  001  001  001
000  000  111  111  001  001  110  110
000  111  000  111  001  110  001  110
010  010  010  010  011  011  011  011
010  010  101  101  011  011  100  100
010  101  010  101  011  100  011  100
```

Since the number of distinct arrays in the control array set $\Box_A$ is one more than the number of columns in the input array $V_{in}$ there necessarily exists at least one array $A \in \Box_A$ such that all the columns of $V_{in} \oplus A$ contain at least t transitions. Similarly, since the number of distinct arrays in the control array set $\Box_B$ is one more than the number of rows in the input array $V_{in}$, there exists at least one array $B \in \Box_B$ such that all the rows of $V_{in} \oplus B$ contain at least t transitions. Therefore, the modulated output array $V'_{in} = V_{in} \oplus (A \oplus B)$ at the output of the first modulator of FIG. 4, has at least t transitions in each row and each column and therefore satisfies $P_1(t)$, (i.e., that in each row and column of the modulated data array there are at least t transitions of the type $(1 \searrow 0)$ or $(0 \nearrow 1)$).

As discussed, the first of two underlying assumptions under which the present invention achieves the first constraint is that for each given vector column $\vec{v}_j$ of input array $V_{in}$ there is at most one array A in the control array set $\Box_A$ such that the number of transitions in the corresponding columns of $V_{in} \oplus A$ is less than the desired number of transitions t. The second assumption is that for any given row $\vec{u}_j$ of the input array $V_{in}$, there is at most one array B in the control array set $\Box_B$ such that the number of transitions in the corresponding row of $V_{in} \oplus B$ is less than t. To show that the above assumptions are indeed true, if the sets of control vectors $\{\vec{a}_0, \vec{a}_1, \ldots, \vec{a}_n\}$ and $\{\vec{b}_0, \vec{b}_1, \ldots, \vec{b}_m\}$ are constructed using the inverse mapping $\phi^{-1}$ from (t−2)-error-correcting codes $C_1$ and $C_2$, as preferred, then for any $\vec{x} \in F_m$, the fact that $\vec{x} + \vec{a}_i$ has less than t transitions implies that $\vec{x} + \vec{a}_j$ has at least t transitions for all j≠i. Similarly, for any $\vec{x} \in F_n$, the fact that $\vec{x} + \vec{b}_i$ has less than t transitions implies that $\vec{x} + \vec{b}_j$ has at least t transitions for all j=i. Otherwise, the following impossibility would result:

$$d(\phi(\vec{x}), \phi(\vec{a}_i)) = |\phi(\vec{x}) + \phi(\vec{a}_i)| = |\phi(\vec{x} + \vec{a}_i)| \leq t-2$$

$$d(\phi(\vec{x}), \phi(\vec{a}_j)) = |\phi(\vec{x}) + \phi(\vec{a}_j)| = |\phi(\vec{x} + \vec{a}_j)| \leq t-2.$$

The last inequality follows from the fact that the Hamming weight of $\phi(\vec{x})$ is equal to the number of transitions in $\vec{x}$. Since $\phi(\vec{a}_i), \phi(\vec{a}_j) \in C_1$, it follows that the mapped vector $\phi(\vec{x})$ is at a distance of at most t2 from two distinct codewords of $C_1$. Because Hamming spheres of radius t−2 about the codewords of $C_1$ are disjoint, this is impossible.

In order to be able to retrieve the original input array $V_{in}$ from the output array $V_{out}$ that is eventually stored in the holographic medium, it is necessary to indicate which control array of the (m+1)(n+1) control arrays in the set $\Box_1$ was applied to the input array $V_{in}$ such that $\Box_1 = \{A \oplus B: A \in \Box_A B \in \Box_B\}$. For this purpose, it is preferable to have all the control arrays in the set $\Box_1$ arranged in a predefined order which are indexed by the integers from 1 to (n+1)(m+1). The index corresponds to the specific selected control array $U \in \Box_1 = A \oplus B$ which was applied to effectuate the modulation of the input array $V_{in}$. This information is preferably encoded in a binary format and appended as an additional column or row to the modulated array $V'_{in} = V_{in} \oplus U$.

As discussed, the control array set $\Box_1$ consists of (m+1)(n+1) control arrays. In order to encode the index of the selected control array U in a binary format and thus indicate which control array was applied to the input array $V_{in}$, a total of about $\log_2(m+1)(n+1)$ bits will be needed. These bits are redundant and constitute the overhead introduced by the modulator for recovery purposes. It should be understood that since the total number of control arrays in $\Box_1$ is kept as small as possible by the techniques disclosed herein, the number of redundant bits which will be needed to keep track of the desired information will be at a minimum. Thus, the modulator of the present invention has the advantage of introducing minimum overhead for the specified modulation constraint.

Notably, the entire first portion of the modulator of the present invention does not require a conversion table. The only information that has to be stored in the modulator of FIG. 4 is the two sets of vectors $\{\vec{a}_0, \vec{a}_1, \ldots, \vec{a}_n\}$ and $\{\vec{b}_0, \vec{b}_1, \ldots, \vec{b}_m\}$ which define the set of control arrays $\square_1$. The selected control array $U \in \square_1$, which is to be applied to the input array $V_{in}$ so that $V'_{in}=V_{in} \oplus U$ satisfies $P_1(t)$, is efficiently reconstructed from these two sets of vectors and the modulation may be effected by simply complementing the columns and the rows of the input array $V_{in}$ according to control vectors $\vec{a}_i$ and $\vec{b}_j$, respectively.

FIG. 5: MODULATION FOR BALANCED 1's AND 0's

In order not to permit wide variations in the radio between the signal beam and the reference beam during recording, the 1's and 0's in any region of the data page should be balanced as well as evenly distributed. To achieve this balancing, a second set of control arrays is constructed.

At this point, it should be understood that the input data array for the second modulator is the output array $V'_{in}$ from the first modulator.

With reference now being made to FIG. 5, construction of the second set of control arrays $\square_2$ is described herein such that for any m×n input data array $V'_{in}$ there exists at least one selected control array $W \in \square_2$, with $V_{out}=V'_{in} \oplus W$ having an equal number of 1's and 0's, or in other words satisfying property $P_2$.

Consider the set of control vectors $\{\vec{w}_0, \vec{w}_1, \vec{w}_2, \ldots, \vec{w}_{mn-1}\}$ given by the set: $\{\vec{w}_0=0000 \ldots 0, \vec{w}_1=1000 \ldots 0, \vec{w}_2=1100 \ldots 0, \vec{w}_3=1110 \ldots 0, \ldots, \vec{w}_{mn-1}=1111 \ldots 10\}$. It is shown in Knuth, "Efficient Balanced Codes", IEEE Transactions on Information Theory, Vol. 32, pp. 51–53, (1986), that for any input vector $\vec{v}$ there exists $\vec{a}$ control vector $\vec{w}_i$ such that $\vec{v}+\vec{w}_i$ contains an equal number of 1's and 0's. A one-to-one correspondence is established between the m×n binary arrays and binary vectors of length mn by writing the input data array as $V'_{in}=[V_{ij}]$ and the binary vector $\vec{v}$ as $\vec{v}=(v_{11}, v_{12}, \ldots, v_{1n}, v_{21}, v_{22}, \ldots, v_{2n}, \ldots, v_{m1}, v_{m2}, \ldots, v_{mn})$, which is the equivalent to using a horizontal row-by-row readout. In effect, the second modulator complements the bits of the input array $V'_{in}$ in the horizontal readout order terminating after the first i bits. Using the horizontal readout correspondence, the set of control arrays $\square_2=\{W_0, W_1, W_2, \ldots, W_{mn-1}\}$ is obtained from the set of control vectors $\{\vec{w}_0, \vec{w}_1, \vec{w}_2, \ldots, \vec{w}_{mn-1}\}$. As a result, for any input m×n binary array $V_{in}$, there exists one control array $W \in \square_2$, such that $V'_{in} \oplus W$ contains an equal number of 1's and 0's, and thereby satisfies $P_2$. For instance, if n=m=3, the control array set $\square_2$ consists of the following mn=9 arrays.

| 000 | 100 | 110 | 111 | 111 | 111 | 111 | 111 | 111 |
| 000 | 000 | 000 | 000 | 100 | 110 | 111 | 111 | 111 |
| 000 | 000 | 000 | 000 | 000 | 000 | 000 | 100 | 110 |

Similarly, as with the first index for the control array applied to the input array $V_{in}$, the index corresponding to the array belonging to the control array set $\square_2$ can be stored as well. This index i is preferably encoded in a binary form containing an equal number of 1's and 0's and appended to the modulated array. Since the control array set $\square_2$ contains exactly mn arrays, encoding the index i in a binary form requires approximately $\log_2(mn)$ redundant bits. The total overhead introduced by the second modulator of FIG. 5 is slightly more than $\log_2(mn)$ redundant bits because the redundant bits also have to be balanced.

FIG. 6: COMBINED MODULATION

It is preferable to have an m×n array which simultaneously satisfies properties $P_1(t)$ and $P_2$. A modulator for this purpose is depicted in FIG. 6. With reference being made thereto, first a set of control arrays $\square_1$ is designed using the first modulator portion of the preferred embodiment for the satisfaction of the property $P_1(t+2)$. A selected control array $U \in \square_1$ is applied to the input data array $V_{in}$ to ensure that $V'_{in}$ satisfies $P_1(t+2)$. Subsequently, several bits of $V'_{in}$ are complemented in the horizontal readout order, as taught above, which is equivalent to adding to $V'_{in}$ a selected control array W drawn from the set of control arrays $\square_2$, so that the resulting array $V_{out}=V'_{in} \oplus W$ satisfies $P_2$. Effectively, the array $V_{out}$ satisfies simultaneously both properties $P_1(t)$ and $P_2$. This is shown to be the case.

To see this, assume that a row vector $\vec{x}=(x_1, x_2, \ldots, x_n) \in F_n$ has (t+2) transitions. If the vector $\vec{x}'$ is given by $(\bar{x}_1, \bar{x}_2, \ldots, \bar{x}_i, x_{i+1}, x_{i+2}, \ldots, x_n)$, where $\bar{x}$ denotes the binary complement of the binary digit x, then the number of transitions in the vector $\vec{x}'$ is at least t because the only transitions which could be present in $\vec{x}$ but not in $\vec{x}'$ are from $x_i$ to $x_{i+1}$ or from $x_n$ to $x_1$. Therefore complementing the first i bits of the vector $\vec{x}$ eliminates at most two transitions. Notice that each row and each column of the array $V_{out}=V'_{in} \oplus W$ complies with this condition, as put forth above, with respect to the corresponding row/column of the input array $V'_{in}$. As a consequence, each row/column of the final array $V_{out}=V'_{in} \oplus W$ must contain at least (t+2)−2=t transitions. Thus, the final modulated output array $V_{out}=(V_{in} \oplus U) \oplus W$ of the modulator of FIG. 6 satisfies both properties $P_1(t)$ and $P_2$ simultaneously.

EXAMPLE (FIG. 6)

In order to further illustrate the operation of the combined modulator shown in FIG. 6, assume that the input data $V_{in}$ is arranged in the form of a 16×16 array. Thus, m=n=16. In order to obtain the sets of arrays $\square_A$ and $\square_B$ for the first constraint, the sets of control vectors $\{\vec{a}_0, \vec{a}_1, \ldots, \vec{a}_n\}$ and $\{\vec{b}_0, \vec{b}_1, \ldots, \vec{b}_m\}$ are first obtained. FIG. 7 illustrates the set of 17 control vectors obtained by applying the inverse mapping $\phi^1$, as discussed above, to some of the 32 even-weight codewords of the first-order Reed-Muller code of length 16. As discussed, for any input 16×16 array $V_{in}$, a vector $\vec{a}_i$ is chosen from the fixed set of 17 control vectors in FIG. 7 such that adding vector $\vec{a}_i$ to all the columns in the input array $V_{in}$ yields at least 4 transitions in each column. Similarly, a vector $\vec{b}_j$ is also chosen from the set of 17 control vectors of FIG. 7 such that adding vector $\vec{b}_j$ to all the rows in the input array $V_{in}$ provides an array with at least 4 transitions per row. Thus, the first index i is found such that adding the vector $\vec{a}_i$ to each column of input binary array $V_{in}$ produces at least 4 transitions in each column, and the first index j is found such that adding the vector $\vec{b}_j$ to each row yields at least 4 transitions in each row.

A correspondence between the integers from 0 to 16, employed to index the vectors of the above set and balanced vectors of length 6 is established and ordered lexicographically according to the following table.

TABLE 1

| 0 | 000111 | 6  | 010110 | 12 | 100110 |
|---|--------|----|--------|----|--------|
| 1 | 001011 | 7  | 011001 | 13 | 101001 |
| 2 | 001101 | 8  | 011010 | 14 | 101010 |
| 3 | 001110 | 9  | 011100 | 15 | 101100 |
| 4 | 010011 | 10 | 100011 | 16 | 110001 |
| 5 | 010101 | 11 | 100101 |    |        |

Once the corresponding indices have been found, the vector $\vec{a}_i$ is added to each column and the vector $\vec{b}_j$ is added to each row in the input data array $V_{in}$. An extra row is appended to the resulting array with the entries of this row being specified as follows. The first 6 bits of the appended row consist of the balanced vector corresponding to the index i in Table 1. The following 6 bits appended consist of the balanced vector corresponding to the index j in Table 1. The last 4 bits appended to the resulting array consist of the arbitrary set {1010} so as to contain an equal number of 1's and 0's. This produces an output 17×16 data array satisfying the property $P_2(4)$ with the last row containing an equal number of 1's and 0's.

To balance the first 16 rows of this resulting array in order to satisfy property $P_2$, let k be the number of bits that have to be complemented in order to balance these 16 rows. Notice that $0 \leq k \leq 255$ and hence 8 bits are needed to write k in binary form. These 8-bits are given as: $<a_7a_6a_5a_4a_3a_2a_1a_0>$. Then, $<a_7a_6a_5a_4>$ is taken to be the binary form of an integer $k_1$ and $a_3a_2a_1a_0$ is taken to be the binary form of an integer $k_2$, where $k_1$, $k_2 < 15$. These integers, $k_1$ and $k_2$, are then associated with the balanced vectors according to Table 1 to produce a vector of length 12. This vector is then concatenated with the binary value 10101 in order to obtain a vector of length 17 which is then appended as the 17-th column of the output array. This completes the modulation.

EXAMPLE (FIGS. 8, 9, 10 AND 11)

Figures 8, 9:
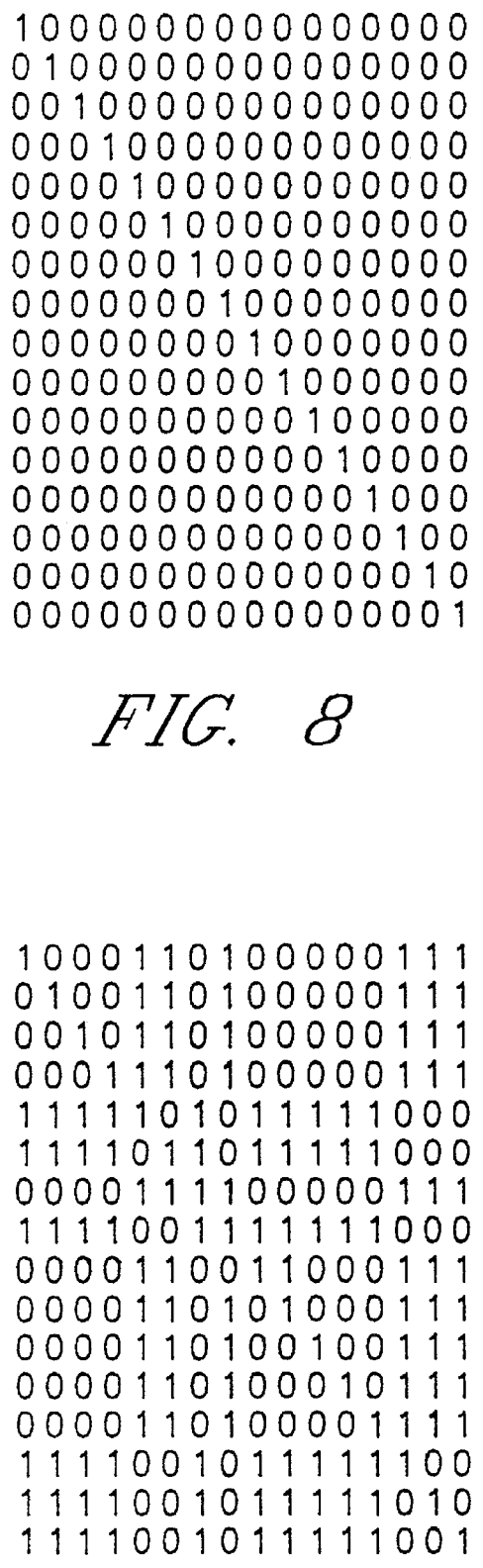

By way of a further example, assume that the input 16×16 binary array $V_{in}$, as shown in FIG. 8, is to be modulated. By counting the number of transitions, it is determined that there are only two (cyclic) transitions in each row and column of this array. Adding the vector $\vec{a}_1$ to each row and to each column increases the number of transitions to at least 4 in each row and column which results in the array $V'_{in}$ shown in FIG. 9, which has to be balanced.

Figures 10, 11:
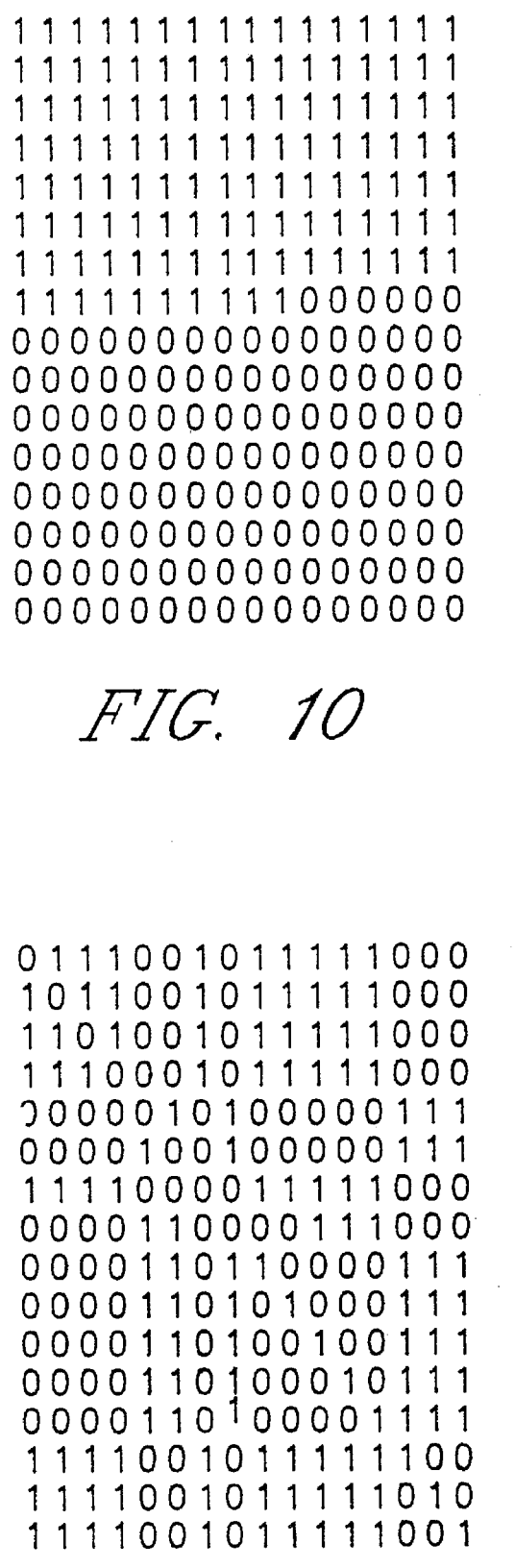

An application of the techniques discussed in Knuth, previously cited, results in an array having k=122 1's, as shown in FIG. 10, for balancing $V'_{in}$ of FIG. 9. Adding the array $V'_{in}$ of FIG. 9 to the balancing array $W \in \square_2$ of FIG. 10 produces the output data array shown in FIG. 11.

This information has to be encoded in the array of FIG. 11. According to Table 1, the index of $\vec{a}_1$ corresponds to the balanced vector 001011. Hence, the following vector is added to the last row of the array of FIG. 11:

0 0 1 0 1 1 0 0 1 0 1 1 1 0 1 0

This produces a 17×16 data array. The balancing array of FIG. 10 had k=122 1's. The binary form of k=122 is 01111010. These 8 bits are broken into two 4-bit vectors <0111> and <1010>. The first vector is the binary representation of the integer 7. The second vector is the binary representation of the integer 10. Once these integers have been obtained, reference is then made to Table 1 wherein the integer 7 corresponds to the balanced vector 011001 and the integer 10 corresponds to the balanced vector 100011. The combination of these two vectors produces the following with trailing equal numbers of 1's and 0's.

0 1 1 0 0 1 1 0 0 0 1 1 1 0 1 0 1

Figure 12:
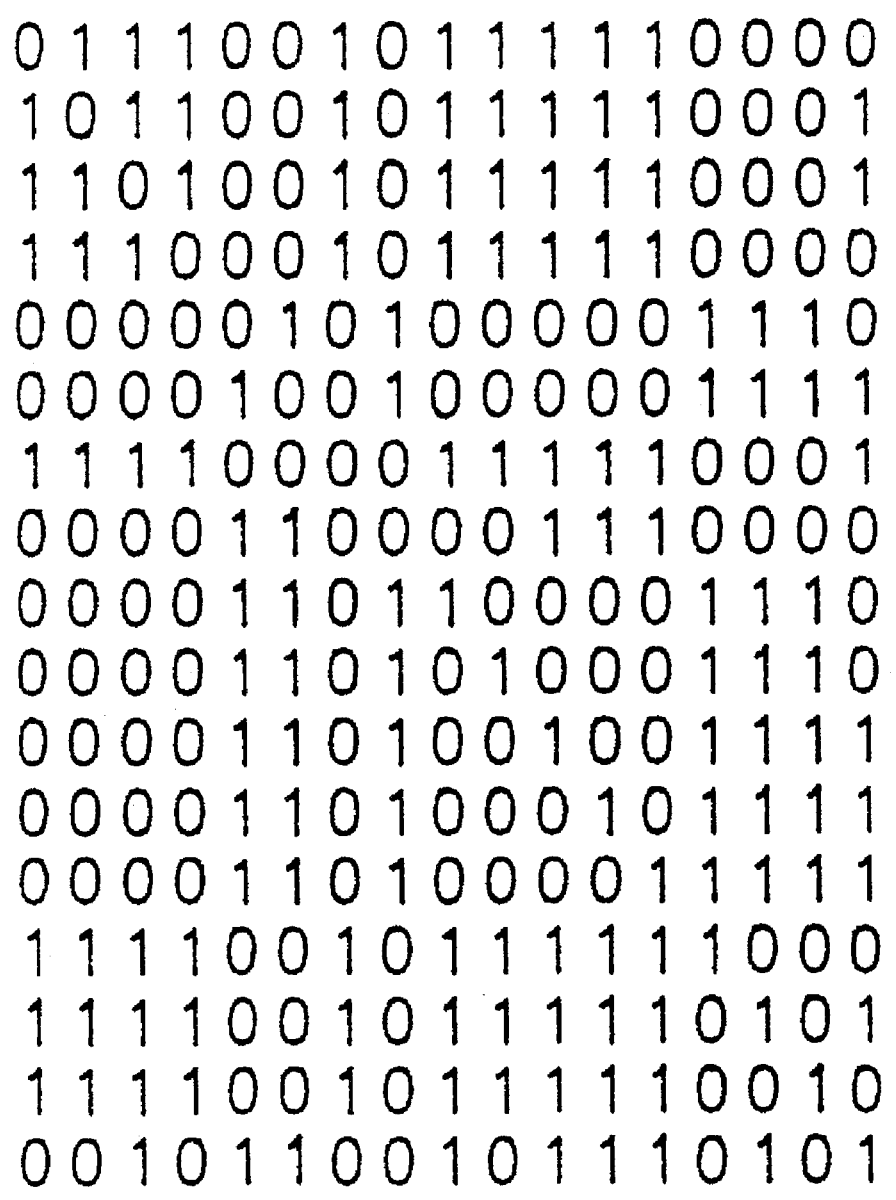

This vector is appended as a 17-th column to the array of FIG. 11. The additional row and column information added to the array of FIG. 11 produces the final modulated 17×17 output array of FIG. 12.

DEMODULATION

Upon reading the stored modulated data arrays, the arrays have to be demodulated. The demodulation process is the modulation process performed in the reversed order. It is important to note that prior to the actual demodulation, the modulated array which is read-out from the holographic storage medium should preferably be checked to determine whether or not the array contains exactly $$\left\lfloor \frac{mn}{2} \right\rfloor$$

zeros. If it does not then the demodulator declares that errors have occurred in the array and passes this information to the error-correcting code if such a code is present in the overall recording system.

SYSTEM BLOCK DIAGRAM (FIG. 13)

Figure 13:
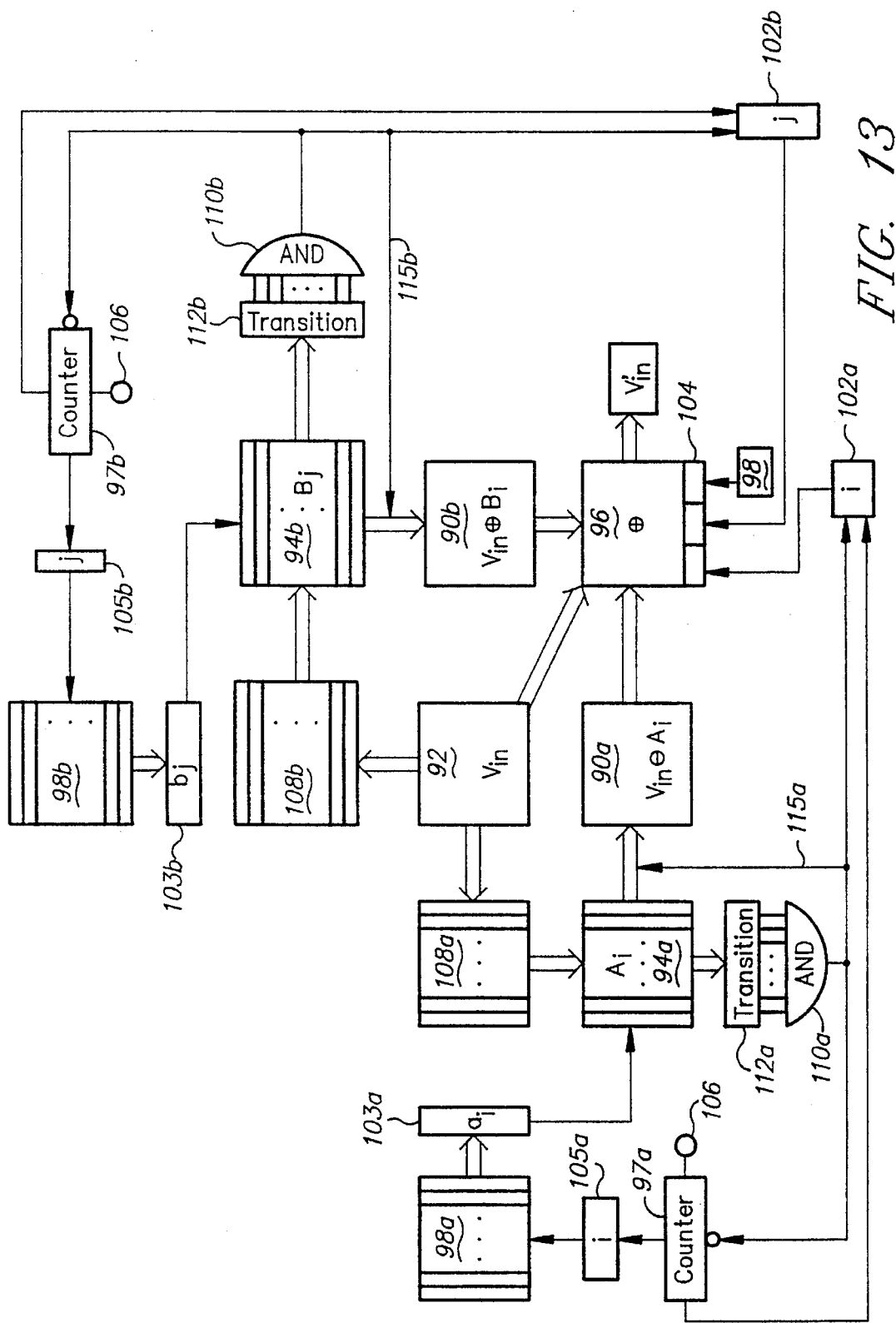
FIG. 13 is a schematic block diagram illustrating one embodiment of the implementation of the present invention.

In order to effectuate the implementation of the modulation techniques of the present invention, attention is directed to FIG. 13 wherein an implementation of the preferred embodiment of the present invention is illustrated by a schematic block diagram.

The array to be modulated is stored in buffer 92. The index counters 97a and 97b are reset by means (not shown). The array to be modulated is directed into the column buffer 108a and the row buffer 108b. Clock trigger 106, connected to index i counter 97a and index j counter 97b, resets and starts the two index counters at a first initial value. The two counters are used to determine the value of index i of the control vector $\vec{a}$ and the value of index j of the control vector $\vec{b}$. These values are stored in i-register 105a and j-register 105b respectively. The content of the i-register 105a is used to select a control vector $\vec{a}_i$ from column i of the a-control vector memory 98a. The content of the j-register 105b is used to select a control vector $\vec{b}_j$ from row j of the b-control vector memory 98b. The selected column vector $\vec{a}_i$ from memory unit 98a is directed into the a-vector buffer 103a. In parallel, the selected row vector $\vec{b}_j$ from memory 98b is directed into the b-vector buffer 103b. The selected column control vector $\vec{a}_i$ stored in 103a is added to each column in the modulation column buffer 94a and the selected row control vector $\vec{b}_j$ stored in 103b is added to each row in the modulation row buffer 94b. The input array stored in column buffer 108a and the input array stored in row buffer 108b are then modulated in their respective column and row modulation buffers 94a and 94b, respectively. Transition counters 112a and 112b count the number of transitions. Counter 112a counts the number of transitions in each column of the modulated array of 94a and counter 112b counts the number of transitions in each row of the modulated array of 94b. The outputs of each of the respective transition counters are bit-wise ANDed in units 110a and 110b. If the number of transitions in either counter is less than the desired number of transitions t then the specified condition for the modulated array has not been met. In that case, the corresponding counter would be incremented to produce the next index value which is used to index the next control array and the cycle would repeat until the desired number of transitions has been achieved by the modulation of the correct column control vector $\vec{a}_i$ and the correct row control vector $\vec{b}_j$ individually. The signal that the number of transitions has been met triggers the output of the modulated array from the array modulator via control lines 115a and 115b so as to signal the corresponding modulation unit to dump that modulated array into buffer 90a or 90b wherein the column modulated array $V_{in} \oplus A_i$ is stored. Control lines 115a and 115b also trigger registers 102a and 102b to save the value of their respective counters 97a and 97b, respectively. At this point, the correct index has been selected such that the control vector $\vec{a}_i$ effectuates the desired number of transitions t and the correct index has been selected such that the control vector $b_j$ effectuates the desired number of transitions t.

Block 96 performs the operation of $(V_{in} \oplus A_i) \oplus V_{in} \oplus (V_{in} \oplus B_j)$. This can be effectuated either through hardware or software means. Since the $\oplus$ operation is modulo-2, the result of the $\oplus$ operation performed in buffer 96 is effectively the operation $V_{in} \oplus (A_i \oplus B_j)$ which produces the output array $V'_{in}$ satisfying property $P_1(t)$ of the present invention.

In order to be able to obtain the original input data array upon retrieval after modulation and storage, the indexes i and j which correspond to the selected control arrays $A_i$ and $B_j$ are encoded into balanced vectors of even lengths $l_1$ and $l_2$, where binomial coefficient $$\begin{pmatrix} l_1 \\ l_1/2 \end{pmatrix} \geq n+1,$$

where the binomial coefficient $$\begin{pmatrix} l_2 \\ l_2/2 \end{pmatrix} \geq n+1.$$

These encoded vectors are then appended to the output array $V'_{in}$ as shown in 104. The corresponding index i, shown at 102a, and the index j, shown at 102b are appended to $V'_{in}$ at 104 along with a binary vector of length $n-(l_1+l_2)$ of the form <1010 . . . > produced binary vector generating unit 98.

The second modulation wherein the balancing of the arrays is done to satisfy property $P_2$ can be readily effectuated by the techniques disclosed in the Knuth reference or the system as taught by U.S. Pat. No. 4,309,694 to Henry which is hereby incorporated by reference being made thereto. It should be understood that the appended extra column contains a balanced vector of length $l_3$ representing the index k of the balancing array $W_k$ followed by a "filler" vector of the form <1010 . . . > of length $(m+1)-l_3$.

OTHER EMBODIMENTS

It should be understood that the modulation techniques of the present invention are extendable to input data arrays of more than two dimensions. The basic ideas involved in the multi-dimensional modulator to be devised in the following are similar to the two dimensional modulation technique. However, the description of the multi-dimensional modulator involves more elaborate notation needed to describe multi-dimensional entities. This notation should be readily followed by one skilled in the art.

Suppose that the data is presented in the form of a $n_1 \times n_2 \times \ldots \times n_k$ k-dimensional binary array $V_{in} = [V_{i_1}, V_{i_2}, \ldots, V_{i_k}]$. A column of the input array $V_{in}$ is then obtained by fixing some k-1 subscripts and letting the remaining, say $\alpha$-th subscript, vary from 1 to $n_\alpha$. More precisely, for $1 \leq \alpha \leq k$, the one-dimensional sequence of binary values $(x_1, x_2, \ldots, x_{n_\alpha})$ is referred to as an $\alpha$-column of the input array $V_{in}$ if $x_i = V_{j_1 j_2 \ldots i\alpha \ldots j_k}$, where $j_\alpha = i$. All the other subscripts are fixed for all $x_1, x_2, \ldots, x_{n_\alpha}$. Conversely, a hyperplane of input array $V_{in}$ is obtained by fixing one subscript and letting the other k-1 subscripts range over all the possible values. Thus, an $\alpha$-hyperplane of $V_{in}$ is a (k-1)-dimensional array given by $[v_{j_1 j_2 \ldots i\alpha \ldots i_k}]$, where $j\alpha$ is fixed at a certain value while, for all $i \neq \alpha$, the subscripts $j_i$ vary from 1 to $n_i$. As such, in the multi-dimensional case property $P_1(t)$ implies that for all $\alpha = 1, 2, \ldots, k$, in each $\alpha$-column of the multi-dimensional output $V'_{in}$ there are at least t transitions of the type $(1 \searrow 0)$ or $(0 \nearrow 1)$.

To show that this indeed the case, for a fixed $\alpha$, complementing all the bits in an $\alpha$-hyperplane of $V_{in}$ affects only the number of transitions in the $\alpha$-columns of input array $V_{in}$ while leaving the number of transitions in the $\alpha'$-columns of input array $V_{in}$ unchanged for all $\alpha' \neq \alpha$. Therefore, all the bits in the one-hyperplanes are complemented in order to ensure that each one-column of input array $V_{in}$ has at least t transitions without affecting the number of transitions in the $\alpha$-columns of input array $V_{in}$ for all $\alpha \neq 1$. Then, the bits in of the two-hyperplanes are complemented to take care of the two-columns without affecting the $\alpha$-columns for all $\alpha \neq 2$, and so on until the property $P_1(t)$ is satisfied in all the $\alpha$-columns in all $\alpha$-hyperplanes of input array $V_{in}$ for $\alpha = 1, 2, \ldots, k$. Indeed, this is achievable in a single step rather than sequentially by means of adding to input array $V_{in}$ the selected control array U which has 1's at all those positions where the entries of input array $V_{in}$ are to be complemented. More precisely, a set of control arrays $\square_1$ indeed can be constructed such that for any $n_1 \times n_2 \times \ldots \times n_k$ input array $V_{in}$ there exists at least one control array $U \in \square_1$, with $V_{in} \oplus U$ satisfying the multi-dimensional property $P_1(t)$.

To achieve this, let $C_1, C_2, \ldots, C_k$ be (t-2)-error-correcting codes of lengths $n_1, n_2, \ldots, n_k$ respectively. Furthermore, suppose that for $\alpha = 1, 2, \ldots k$ the error-correcting code $C_\alpha$ contains at least $$\begin{pmatrix} \prod_{i=1, i \neq \alpha}^{k} n_i \end{pmatrix} + 1$$

codewords of even weight. Note that $$m_\alpha = \prod_{i=1, i \neq \alpha}^{k} n_i$$

is just the number of α-columns in the input array $V_{in}$. As a result, (as in the two-dimensional case) the requirement that $|C_\alpha| \geq m_\alpha + 1$ for each α determines the highest attainable number of transitions t. In other words, t is such that the error-correcting codes $C_1, C_2, \ldots, C_k$ exist for all $\alpha=1,2,\ldots, k$. For example, if k=3 and $n_1=n_2=n_3=15$, the highest attainable value of the number of transitions is t=4.

Consider the sets $\phi^{-1}(C_1), \phi^{-1}(C_2), \ldots, \phi^{-1}(C_k)$, which can be obtained from the error-correcting codes $C_1, C_2, \ldots, C_k$ (as in the two-dimensional case). Let the vectors $\vec{a}_0^\alpha$, $\vec{a}_1^\alpha, \ldots, \vec{a}_{m_\alpha}^\alpha$ be some $m_\alpha+1$ fixed elements of the inversely mapped set $\phi^{-1}(C_\alpha)$. Then, the set of $m_\alpha+1$ k-dimensional $n_1 \times n_2 \times \ldots \times n_k$ control arrays $\square_A^\alpha = \{A_0^\alpha, A_1^\alpha, \ldots, A_{m_\alpha}^\alpha\}$ is constructed from the control vectors $\vec{a}_0^\alpha$, $\vec{a}_1^\alpha, \ldots, \vec{a}_{m_\alpha}^\alpha$. For i=0,1,..., $M_\alpha$ each control array $A_1^\alpha$ is composed of $n_\alpha$ predetermined α-hyperplanes with all the entries in each such α-hyperplane being either all 0's or all 1's. More specifically, all the entries in the j-th α-hyperplane of array $A_1^\alpha$ are taken to be equal to the j-th entry of the control vector $\vec{a}_1^\alpha$. Once the control array sets $\square_A^1, \square_A^2, \ldots, \square_A^k$ have been constructed, the required set of $(m_1+1)(m_2+1) \ldots (m_k+1)$ k-dimensional control arrays $\square_1$ is obtained as the modulo 2 sum of these sets, as before, namely:

$$\square_1 = \{A^1 \oplus A^2 \oplus \ldots \oplus A^k : A^1 \in \square_A^1, A^2 \in \square_A^2, \ldots, A^k \in \square_A^k\}.$$

Just as in the two-dimensional case, for any $n_1 \times n_2 \times \ldots \times n_k$ input array $V_{in}$, there exists at least one control array $U \in \square_1$ such that $V_{in} \oplus U$ satisfies the multi-dimensional property $P_1(t)$.

Property $P_2$ is a global property relating to the total number of 1's and 0's in the array and does not depend on the dimensionality of the array. Therefore, the prior definition of $P_2$ applies for the multi-dimensional case as well and is not shown herein.

Finally, it is preferable to have both properties $P_1(t)$ and $P_2$ satisfied simultaneously in the output multi-dimensional array. This may be accomplished in the same way as in the two-dimensional case, namely, the input array $V_{in}$ is modulated such that the property $P_1(t+2)$ is satisfied. Then, the entries of the resulting array are sequentially complemented in a specified readout order until the total number of 1's and 0's becomes equal. If the readout is performed recurrently hyperplane by hyperplane then that final output array simultaneously satisfies properties $P_1(t)$, and $P_2$.

The number of redundant bits required by the multi-dimensional modulation encoder described above is the logarithm of the cardinality of the set $\square_1$ which is given by: $\log_2(m_1+1), \ldots, (m_k+1) \approx (k-1)\log_2 N$, where $N = n_1 \times n_2 \times \ldots \times n_k$ is the total number of information bits in the input array $V_{in}$. Thus, the overhead introduced by the multi-dimensional modulator is still logarithmic in the length of its input thereby minimizing the overhead.

It should be understood that the specific implementations of the modulation techniques disclosed and claimed herein represent only one embodiment of the present invention. It is envisioned that the present modulator will find uses in the areas of holographic storage systems and applications along with other uses contemplated wherein the application of the modulation techniques of the present invention solve similar problems to those in the prior art. Although complex, the modulation techniques herein are such that one skilled in this art should readily be able to implement and/or adapt the disclosed techniques to their specific system/environment either through hardware or software means.

In summary, a modulator is disclosed and claimed herein which provides for modulation of data pages stored in a holographic medium. The present invention modulates the data pages such that long periodic stretches of contiguous light or dark regions in any of the dimensions of the holographic medium are eliminated. In addition, the number of 1's and 0's stored in the holographic medium are divided into the same number of 1's and 0's independent of data content. To achieve this, the present invention provides for a set of control arrays $\square_1$ from two fixed sets of m×n binary arrays $\square_A = \{A_0, A_1, \ldots, A_n\}$ and $\square_B = \{B_0, B_1, \ldots, B_m\}$. The individual control vectors $\vec{a}_0, \vec{a}_1, \ldots, \vec{a}_n$ are any n+1 fixed elements of the inverse mapping $\phi^{-1}(C_1)$ of the (t-2) error-correcting code $C_1$ of length m. The control vectors $\vec{b}_0, \vec{b}_1, \ldots, \vec{b}_m$ are any m+1 fixed elements of the inverse mapping $\phi^{-1}(C_2)$ of the (t-2) error-correcting code $C_2$ of length n. The first modulation portion is then achieved by performing the operation $V_{in} = A \oplus B$ for each array element A of $\square_A$ and each array element B of the set $\square_B$. To perform the balancing of the modulated array, a second set of control arrays $\square_2 = \{w_0, w_1, w_2, \ldots, w_{mn-1}\}$ is constructed from the set of control vectors $\{\vec{w}_0, \vec{w}_1, \vec{w}_2, \ldots, \vec{w}_{mn-1}\}$. The bits of the input binary array $V_{in}$ are complemented in a horizontal readout order terminating after the first i bits. This produces a final modulated output array, given by $V_{out} = (V_{in} \oplus U) \oplus W$, which achieves the objectives of the present invention.

This invention may be embodied in other specific forms without departing from its spirit or essential characteristics. The above-described embodiments of the present invention are to be considered in all respects only as illustrative and not restrictive in scope. The scope of the invention is, therefore, indicated by the appended claims rather than by the above-detailed description. Therefore, all changes which come within the meaning and range of equivalency of the claims are to be considered embraced within their scope.

What is claimed and desired to be secured by United States Letters Patent is:

1. A combination modulation apparatus for modulating a multi-dimensional input data array containing data in the form of illuminated and dark regions to be stored in a holographic storage system, the apparatus comprising:

a) first modulator means for modulating a data array input thereto, to produce a first modulated array, the first modulated array having at least a threshold number of transitions;

b) second modulator means for modulating a data array input thereto, to produce a second modulated array, the second modulated array having a predetermined ratio of illuminated to dark regions; and c) means:
      (i) for causing the first modulator means to operate on the multi-dimensional input data array containing data to be stored, to produce modulated data having at least the threshold number of transitions, whereby, when the modulated data is stored in the holographic storage system, interference is minimized between adjacent images; and
      (ii) for causing the second modulator means to operate on the multi-dimensional input data array containing data to be stored, to produce modulated data having the predetermined ratio of illuminated to dark regions, whereby, when the modulated data is stored in the holographic storage system, noise encountered while differentiating between the illuminated and dark regions is reduced.

2. A holographic data storage and retrieval system for storing and retrieving multi-dimensional data arrays containing illuminated and dark regions, wherein data arrays stored in the system are modulated such that, in each row and column of an output modulated data array page $V_{out}$, there are at least a threshold number t of transitions, where t is a predetermined integer greater than 2, the system comprising:

a) central processing means for controlling the holographic storage and retrieval system;

b) holographic storage medium means, in communication with said central processing means, for retaining an image of the data array to be stored;

c) first modulator means, interfaced with said central processing means, for modulating a data array input thereto, to produce a first modulated array, the first modulated array having at least the threshold number of transitions; and d) means for causing the first modulator means to operate on a multi-dimensional input data array containing data to be stored, to produce modulated data having at least the threshold number of transitions, whereby, when the modulated data is stored in the holographic storage system, interference is minimized between adjacent images.

3. A holograghic data storage and retrieval system as in claim 2, further comprising:

e) second modulator means, interfaced with said central processing means, for modulating a data array input thereto, to produce a second modulated array, the second modulated array having a predetermined ratio of illuminated to dark regions;

wherein the means for causing further includes means for causing the second modulator means to operate on the multi-dimensional input data array containing data to be stored, to produce modulated data having the predetermined ratio of illuminated to dark regions, whereby, when the modulated data is stored in the holographic storage system, noise encountered while differentiating between illuminated and dark regions is reduced.

* * * * *